US011269012B1

(12) United States Patent
Kahn et al.

(10) Patent No.: US 11,269,012 B1
(45) Date of Patent: Mar. 8, 2022

(54) BATTERY MODULES FOR DETERMINING TEMPERATURE AND VOLTAGE CHARACTERISTICS OF ELECTROCHEMICAL CELLS, AND ASSOCIATED METHODS

(71) Applicant: Element Energy, Inc., Menlo Park, CA (US)

(72) Inventors: Seth Marshall Kahn, San Francisco, CA (US); Arnaud Devie, Menlo Park, CA (US); Corrado Cammi, Mountain View, CA (US); Nathan Thomas Brinkerhoff, Santa Clara, CA (US)

(73) Assignee: Element Energy, Inc., Menlo Park, CA (US)

( * ) Notice: Subject to any disclaimer, the term of this patent is extended or adjusted under 35 U.S.C. 154(b) by 0 days.

(21) Appl. No.: 17/379,856

(22) Filed: Jul. 19, 2021

(51) Int. Cl.
*G01R 31/374* (2019.01)
*H02J 7/00* (2006.01)
*G01R 31/3835* (2019.01)
*H01M 10/48* (2006.01)

(52) U.S. Cl.
CPC ....... *G01R 31/374* (2019.01); *G01R 31/3835* (2019.01); *H01M 10/486* (2013.01); *H02J 7/0014* (2013.01); *H02J 7/0016* (2013.01); *H02J 7/0031* (2013.01)

(58) Field of Classification Search
CPC ............. G01R 31/374; G01R 31/3835; H01M 10/486; H01M 2010/4271; H02J 7/0014; H02J 7/0016; H02J 7/0031; H02J 7/0029; H02J 7/00309; H02J 7/007192; H02J 7/0091; B60L 58/22

USPC .................................. 320/134, 136; 702/63
See application file for complete search history.

(56) References Cited

U.S. PATENT DOCUMENTS

| 6,160,441 | A | 12/2000 | Stratakos et al. |
| 6,262,558 | B1 | 7/2001 | Weinberg |
| 6,445,244 | B1 | 9/2002 | Stratakos et al. |
| 6,835,491 | B2 | 12/2004 | Gartstein et al. |
| 6,984,970 | B2 | 1/2006 | Capel |
| 7,068,017 | B2 | 6/2006 | Willner et al. |
| 8,158,877 | B2 | 4/2012 | Klein et al. |
| 8,395,519 | B2 | 3/2013 | Cassidy |

(Continued)

FOREIGN PATENT DOCUMENTS

WO 2015200366 A1 12/2015

OTHER PUBLICATIONS

Walker, Geoffrey R., et al., "Cascaded DC-DC Converter Connection of Photovoltaic Modules", IEEE Transactions on Power Electronics, vol. 19, No. 4, (Jul. 2004), 1130-1139.

(Continued)

*Primary Examiner* — Richard Isla
*Assistant Examiner* — Mohammed J Sharief
(74) *Attorney, Agent, or Firm* — PdZ Patent Law, PLLC

(57) ABSTRACT

A method for determining a temperature characteristic of an electrochemical cell assembly includes (1) sensing a first voltage via one or more thermistors electrically coupled to the electrochemical cell assembly while loading circuitry electrically coupled to the thermistors is deactivated, (2) sensing a second voltage via the one or more thermistors while the loading circuitry is activated, and (3) determining the temperature characteristic of the electrochemical cell assembly at least partially from the first and second voltages.

20 Claims, 13 Drawing Sheets

(56) References Cited

U.S. PATENT DOCUMENTS

| | | | |
|---|---|---|---|
| 8,686,693 B2 | 4/2014 | Bhowmik et al. | |
| 9,172,120 B2 | 10/2015 | Pariseau et al. | |
| 9,331,497 B2 | 5/2016 | Beaston | |
| 9,425,631 B2 | 8/2016 | Furtner | |
| 9,705,341 B2 | 7/2017 | Komatsu et al. | |
| 9,806,545 B2 | 10/2017 | Fink | |
| 9,865,901 B2 | 1/2018 | Hwang | |
| 10,018,682 B2 | 7/2018 | Kaupp et al. | |
| 10,153,651 B2 | 12/2018 | Taylor et al. | |
| 10,270,262 B2 | 4/2019 | Kim et al. | |
| 10,553,851 B2 | 2/2020 | Kim | |
| 10,804,690 B2 | 10/2020 | Ronne et al. | |
| 10,992,149 B1 | 4/2021 | Kahn et al. | |
| 2004/0135544 A1* | 7/2004 | King | B60W 10/26 320/116 |
| 2005/0121067 A1 | 6/2005 | Toyomura et al. | |
| 2005/0139258 A1 | 6/2005 | Liu et al. | |
| 2008/0236648 A1 | 10/2008 | Klein et al. | |
| 2008/0303503 A1 | 12/2008 | Wolfs | |
| 2009/0284078 A1 | 11/2009 | Zhang et al. | |
| 2009/0284232 A1 | 11/2009 | Zhang et al. | |
| 2009/0284240 A1 | 11/2009 | Zhang et al. | |
| 2009/0284998 A1 | 11/2009 | Zhang et al. | |
| 2010/0207455 A1 | 8/2010 | Erickson, Jr. et al. | |
| 2010/0253150 A1 | 10/2010 | Porter et al. | |
| 2010/0288327 A1 | 11/2010 | Lisi et al. | |
| 2010/0327659 A1 | 12/2010 | Lisi et al. | |
| 2011/0062784 A1 | 3/2011 | Wolfs | |
| 2011/0090607 A1 | 4/2011 | Luebke et al. | |
| 2011/0141644 A1 | 6/2011 | Hastings et al. | |
| 2011/0301772 A1 | 12/2011 | Zuercher et al. | |
| 2012/0013201 A1 | 1/2012 | Pariseau et al. | |
| 2012/0043818 A1 | 2/2012 | Stratakos et al. | |
| 2012/0043823 A1 | 2/2012 | Stratakos et al. | |
| 2012/0043923 A1 | 2/2012 | Ikriannikov et al. | |
| 2012/0044014 A1 | 2/2012 | Stratakos et al. | |
| 2012/0112760 A1 | 5/2012 | Yoscovich et al. | |
| 2012/0119746 A1 | 5/2012 | Macris | |
| 2012/0133521 A1 | 5/2012 | Rothkppf et al. | |
| 2013/0004811 A1* | 1/2013 | Banerjee | H01M 10/486 429/62 |
| 2013/0033102 A1* | 2/2013 | Goff | B60L 50/66 307/10.6 |
| 2013/0049678 A1* | 2/2013 | Li | H02J 7/007182 320/107 |
| 2013/0092208 A1 | 4/2013 | Robbins | |
| 2013/0106194 A1 | 5/2013 | Jergovic et al. | |
| 2013/0170084 A1 | 7/2013 | Strobl et al. | |
| 2013/0176401 A1 | 7/2013 | Monari et al. | |
| 2014/0253045 A1 | 9/2014 | Poznar | |
| 2014/0368205 A1 | 12/2014 | Svensson et al. | |
| 2014/0373894 A1 | 12/2014 | Stratakos et al. | |
| 2016/0059732 A1* | 3/2016 | Loftus | B60L 58/22 701/22 |
| 2016/0372940 A1 | 12/2016 | Canadi | |
| 2017/0092996 A1* | 3/2017 | Rodriguez | H02J 7/0047 |
| 2017/0123008 A1 | 5/2017 | Frias et al. | |
| 2018/0147947 A1 | 5/2018 | Gebhart | |
| 2019/0198938 A1 | 6/2019 | Fujita et al. | |
| 2019/0361075 A1 | 11/2019 | Lee et al. | |
| 2019/0379089 A1* | 12/2019 | Kim | H02H 7/18 |
| 2020/0127489 A1 | 4/2020 | Chen et al. | |
| 2020/0207219 A1 | 7/2020 | Slepchenkov et al. | |
| 2020/0343755 A1* | 10/2020 | Jang | H01M 50/581 |
| 2020/0350779 A1 | 11/2020 | Tikhonski et al. | |

OTHER PUBLICATIONS

Wolfs, Peter, et al., "Distributed Maximum Power Tracking for High Performance Vehicle Solar Arrays", Australian Universities Power Engineering Conference (AUPEC 2004), (Sep. 2004), 6 pgs.

* cited by examiner

BATTERY MODULES FOR DETERMINING TEMPERATURE AND VOLTAGE CHARACTERISTICS OF ELECTROCHEMICAL CELLS, AND ASSOCIATED METHODS

BACKGROUND

A battery is an energy storage device including one or more electrochemical cells. Batteries are widely used as electrical power sources in applications where a continuous connection to a fixed electrical power source, such as an electrical utility grid, is undesirable or infeasible. For example, batteries are widely used to power mobile information technology devices, such as mobile telephones and tablet computers. Additionally, batteries are increasingly being used as a power source in vehicles, either as a vehicle's sole power source or to supplement a vehicle's internal combustion engine. It is anticipated that batteries will largely supplant internal combustion engines in future new vehicles.

Furthermore, there is great interest in using batteries in electrical infrastructure to store energy. For example, an electrical utility may charge a battery to store energy when there is a surplus of electrical power, and the electrical utility may subsequently discharge the battery to withdraw the stored energy when additional electrical power is needed. Accordingly, batteries are anticipated to be a key component in the ongoing transition from fossil fuel electrical power sources to renewable electric power sources, as batteries can compensate for the intermittent nature of many renewable electrical power sources.

It is often necessary to connect multiple electrochemical cells in series to obtain a sufficiently high battery voltage. Therefore, a battery will often include two or more electrochemical cells connected in series. Furthermore, multiple batteries often need to be connected in series to obtain a sufficiently high battery bus voltage. Accordingly, a practical battery application may include a stack of many electrochemical cells connected in series. Unfortunately, while all electrochemical cells in a stack may be of the same make and model, the cells of the stack will typically have non-uniform characteristics, such as non-uniform equivalent series resistance (ESR), non-uniform capacity, and non-uniform state of degradation. Such non-uniform characteristics result, for example, from differences in cell construction due to manufacturing tolerances, differences in rate of cell aging, and differences in cell environment within a stack. Consequently, electrochemical cells in a stack may not charge or discharge at a uniform rate. For example, all cells of the stack should ideally have the same state-of-charge (SOC) at any given time during a charge or discharge cycle. However, non-uniform characteristics of the cells will typically cause SOC to vary among the cells at any given time during a charge or discharge cycle.

Additionally, temperature may vary among electrochemical cells in a stack. For example, non-uniform characteristics of electrochemical cells, such as non-uniform ESR, non-uniform state of degradation, and/or non-uniform presence of internal soft short circuits, may cause variation in power dissipated in electrochemical cells, thereby causing temperature to vary among electrochemical cells. As another example, cell environment may vary within a stack, such as due to variation in cooling system efficacy within the stack or failure of a cooling subsystem within the stack, thereby causing electrochemical cell temperature to vary even if all cells dissipate uniform power within the stack.

Non-uniform SOC among electrochemical cells in a stack is undesirable because it restricts capacity and operating range of the stack. For example, depth of discharge of a stack will be limited by an electrochemical cell of the stack having a lowest SOC. Additionally, non-uniform temperature of electrochemical cells in a stack is generally undesirable. For example, electrochemical cells operating at different temperatures may degrade at different rates. Furthermore, operation of electrochemical cells at a high temperature may result in premature electrochemical cell failure or even catastrophic electrochemical cell failure. Accordingly, a battery management system (BMS) is commonly used to mitigate, or even prevent, unbalanced SOC among batteries, or among electrochemical cells within a battery, as well to monitor and/or control electrochemical cell temperature within a battery. For example, a BMS may use resistors to discharge electrochemical cells at higher SOC until the cells reach the same SOC as electrochemical cells at a lower SOC, so that all cells are at the same SOC. As another example, electrochemical cells of a stack may be buffered by direct-current-to-direct-current (DC-to-DC) converters, and the DC-to-DC converters may be used to individually control cell charge/discharge rate such that all electrochemical cells are at approximately the same SOC, based on information such as electrochemical cell voltage, electrochemical cell current, and/or electrochemical cell temperature.

SUMMARY

In a first aspect, a method for determining a temperature characteristic of an electrochemical cell assembly includes (a) sensing a first voltage via one or more thermistors electrically coupled to the electrochemical cell assembly while loading circuitry electrically coupled to the thermistors is deactivated, (b) sensing a second voltage via the one or more thermistors while the loading circuitry is activated, and (c) determining the temperature characteristic of the electrochemical cell assembly at least partially from the first and second voltages.

In an embodiment of the first aspect, the one or more thermistors are thermally coupled with electrochemical cells of the electrochemical cell assembly.

In another embodiment of the first aspect, the one or more thermistors are integrated with the electrochemical cell assembly.

In another embodiment of the first aspect, the method further includes activating the loading circuitry by causing the loading circuitry to draw an electric current through the one or more thermistors.

In another embodiment of the first aspect, the loading circuitry is configured to balance a state of charge of the electrochemical cell assembly.

In another embodiment of the first aspect, the first voltage is a voltage across one or more electrochemical cells of the electrochemical cell assembly.

In another embodiment of the first aspect, the method further includes determining a voltage of the electrochemical cell assembly at least partially based on the first voltage.

In another embodiment of the first aspect, determining the temperature characteristic of the electrochemical cell assembly at least partially from the first and second voltages includes (1) determining a resistance of the one or more thermistors at least partially from the first and second voltages, and (2) determining the temperature characteristic of the electrochemical cell assembly from the resistance of the one or more thermistors.

In another embodiment of the first aspect, the one or more thermistors include a plurality of thermistors, and the resistance of the one or more thermistors is a total resistance of the one or more thermistors.

In another embodiment of the first aspect, the temperature characteristic of the electrochemical cell assembly is an absolute temperature of the electrochemical cell assembly.

In another embodiment of the first aspect, the temperature characteristic of the electrochemical cell assembly is a relative temperature of the electrochemical cell assembly.

In a second aspect, an electrochemical cell assembly configured for voltage and temperature sensing via a common pair of electrical terminals includes (a) one or more electrochemical cells electrically coupled between a first battery node and a second battery node, (b) a first thermistor, (c) a first electrical terminal for sensing voltage and temperature of the electrochemical cell assembly, the first electrical terminal being electrically coupled to the first battery node via the first thermistor, and (d) a second electrical terminal for sensing voltage and temperature of the electrochemical cell assembly, the second electrical terminal being electrically coupled to the second battery node.

In an embodiment of the second aspect, the electrochemical cell assembly further includes a second thermistor, wherein the second electrical terminal is electrically coupled to the second battery node via the second thermistor.

In another embodiment of the second aspect, each of the first and second thermistors is thermally coupled with the one or more electrochemical cells.

In a third aspect, a battery module includes (a) one or more electrochemical cells electrically coupled between a first battery node and a second battery node, (b) one or more thermistors, (c) a voltage sensing device electrically coupled across the first and second battery nodes via the one or more thermistors, and (d) loading circuitry configured to draw an electric current through the one or more thermistors when the loading circuitry is activated.

In an embodiment of the third aspect, the one or more thermistors are thermally coupled with the one or more electrochemical cells.

In another embodiment of the third aspect, the voltage sensing device includes a first sensing terminal and a second sensing terminal, and the one or more thermistors include (a) a first thermistor electrically coupled between the first battery node and the first sensing terminal and (b) a second thermistor electrically coupled between the second battery node and the second sensing terminal.

In another embodiment of the third aspect, the voltage sensing device includes an analog-to-digital converter.

In another embodiment of the third aspect, the loading circuitry includes a switching device and one or more resistive devices electrically coupled in series across two terminals of the voltage sensing device.

In another embodiment of the third aspect, the loading circuitry includes a current source.

In another embodiment of the third aspect, the loading circuitry is further configured to balance a state of charge of the one or more electrochemical cells.

In a fourth aspect, a stack includes any one of the battery modules of the third aspect and a controller configured to (a) cause the voltage sensing device to sense a first voltage while the loading circuitry is deactivated, (b) cause the voltage sensing device to sense a second voltage while the loading circuitry is activated, and (c) determine a temperature characteristic of the one or more electrochemical cells at least partially from the first and second voltages.

In an embodiment of the fourth aspect, the controller is further configured to determine the temperature characteristic of the one or more electrochemical cells at least partially from the first and second voltages at least partially by (a) determining a resistance of the one or more thermistors at least partially from the first and second voltages and (b) determining the temperature characteristic of the one or more electrochemical cells from the resistance of the one or more thermistors.

In a fifth aspect, a method for determining a temperature characteristic of an electrochemical cell assembly includes (a) sensing a plurality of first voltages via thermistors electrically coupled to electrochemical cells of the electrochemical cell assembly while loading circuitry electrically coupled to the thermistors is deactivated, (b) sensing a plurality of second voltages via the thermistors while the loading circuitry is activated, and (c) determining the temperature characteristic at least partially from the plurality of first voltages and the plurality of second voltages.

In an embodiment of the fifth aspect, the temperature characteristic is a relative temperature of the electrochemical cell assembly.

In another embodiment of the fifth aspect, the relative temperature of the electrochemical cell assembly is a temperature of the electrochemical cell assembly relative to a temperature of one or more other electrochemical cell assemblies.

In another embodiment of the fifth aspect, the relative temperature of the electrochemical cell assembly is a temperature of the electrochemical cell assembly relative to a mathematical function of respective temperatures of two or more other electrochemical cell assemblies.

In another embodiment of the fifth aspect, the relative temperature of the electrochemical cell assembly is a current temperature of the electrochemical assembly relative to a previous temperature of the electrochemical assembly.

DETAILED DESCRIPTION OF THE EMBODIMENTS

Figure 1:
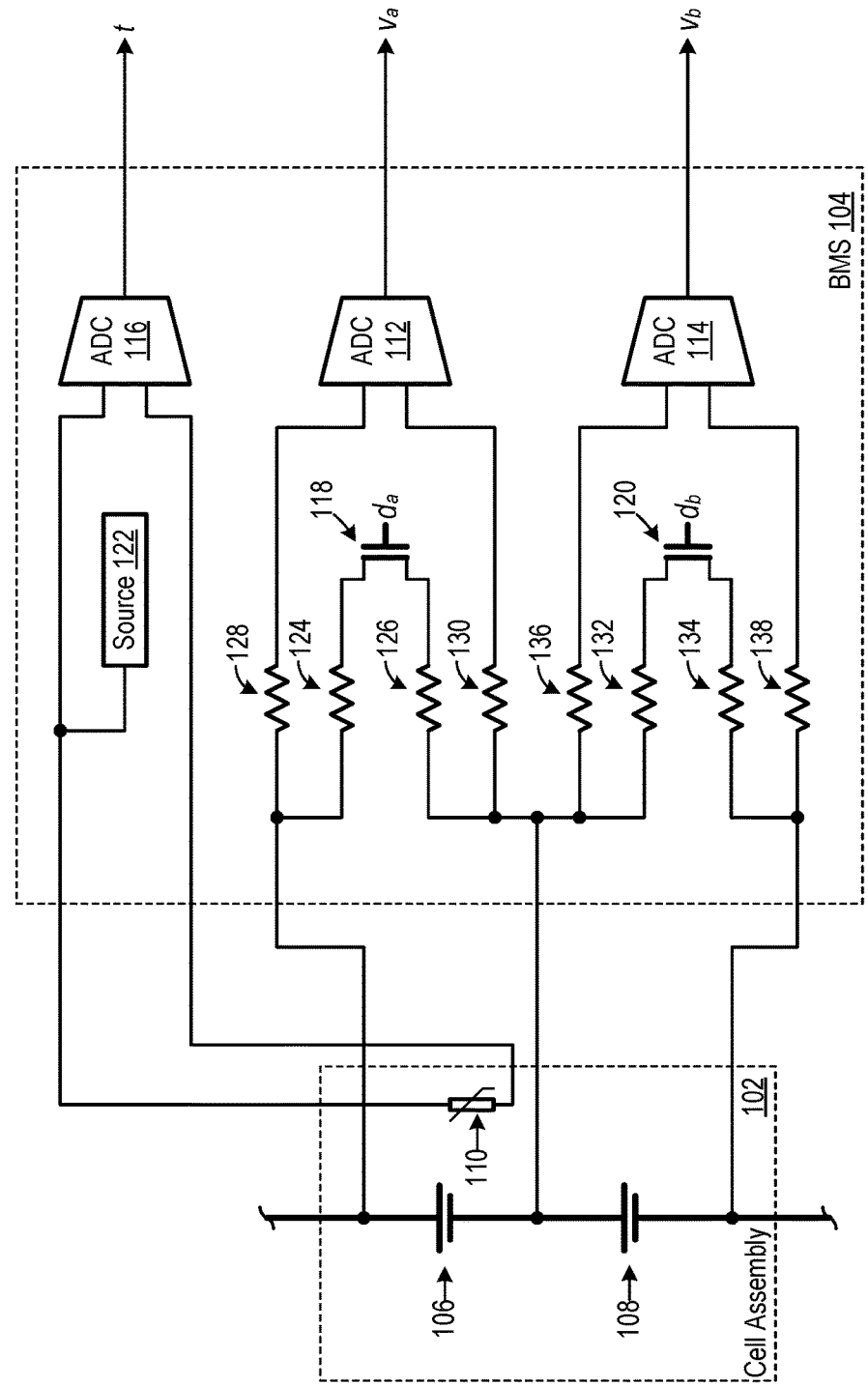
FIG. 1 is a block diagram of a conventional battery module capable of measuring voltage and temperature.

A high-performance battery management system (BMS) typically requires knowledge of electrochemical cell voltage, electrochemical cell current, and electrochemical cell temperature, such as to determine cell SOC, cell state-of-safety (SOS), and/or cell state of degradation (SOD). For example, an electrochemical cell temperature signature, or its change in temperature versus time, may provide an early indication of a cell failure mode, such as elevated cell impedance or a short circuit within the cell. Accordingly, a BMS typically includes circuitry for generating respective signals representing electrochemical cell voltage and electrochemical cell temperature. For example, FIG. 1 is a block diagram of a conventional battery module 100 that is capable of measuring cell assembly voltage and cell assembly temperature. Battery module 100 includes an electrochemical cell assembly 102, hereinafter referred to as cell assembly 102 for brevity, and a BMS 104. A plurality of battery modules 100 may be combined to form a stack (not shown), where cell assemblies 102 of each module are electrically coupled in series. Cell assembly 102 includes electrochemical cells 106 and 108 electrically coupled in series, as well as a thermistor 110 for sensing temperature of cell assembly 102.

BMS 104 includes an analog-to-digital converter (ADC) 112, an ADC 114, an ADC 116, a transistor 118, a transistor 120, an electrical power source 122, and resistors 124, 126, 128, 130, 132, 134, 136, and 138. Resistor 124, resistor 126, and transistor 118 are collectively configured to discharge electrochemical cell 106, such as for balancing SOC of a plurality of electrochemical cells in a stack. Specifically, transistor 118 operates in its on-state when discharge signal $d_a$ is asserted, such that resistors 124 and 126 are electrically coupled in series across electrochemical cell 106 of cell assembly 102. Current flowing from electrochemical cell 106 through resistors 124 and 126 discharges electrochemical cell 106. ADC 112 samples voltage across electrochemical cell 106 via filter resistors 128 and 130 to generate a digital signal $v_a$ representing voltage across electrochemical cell 106. Transistor 120 and resistors 132 and 134 operate in an analogous manner to discharge electrochemical cell 108 in response to discharge signal $d_b$, and ADC 114 and resistors 136 and 138 operate in an analogous manner to generate a digital signal $v_b$ representing voltage across electrochemical cell 108. Electrical power source 122 biases thermistor 110, and ADC 116 samples voltage across thermistor 110, which is dependent on temperature of cell assembly 102, to generate a digital signal t representing temperature of the cell assembly.

It may be relatively difficult and costly to attach temperature sensors to cell assemblies and to wire the temperature sensors to a BMS. Consequentially, a conventional battery module typically does not include a temperature sensor for each electrochemical cell of the module. Instead, a conventional battery module typically includes at most a few temperature sensors for sensing temperature of an electrochemical cell assembly of the module. For example, conventional battery module 100 of FIG. 1 includes a single temperature sensor (thermistor 110) in cell assembly 102, instead of a respective temperature sensor for each electrochemical cell 106 and 108. Accordingly, conventional battery modules are typically incapable of sensing individual electrochemical cell temperatures.

Disclosed herein are new battery modules and associated methods which at least partially overcome the above-discussed drawbacks of conventional battery modules. The new battery modules include an electrochemical cell assembly with temperature sensing devices that form part of voltage sensing circuitry as well as temperature sensing circuitry. The temperature sensing devices are electrically coupled between electrochemical cells and dual-purpose electrical terminals that are configured for sensing both a voltage and a temperature characteristic. Consequently, some embodiments are capable of sensing temperature of each electrochemical cell without requiring dedicated electrical connections between temperature sensing devices and a BMS, thereby making cell-level temperature sensing practical in applications where cell-level temperature sensing would be impractical using conventional techniques. Additionally, some embodiments are capable of individually sensing electrochemical cell anode temperatures and electrochemical cell cathode temperatures.

Figure 2:
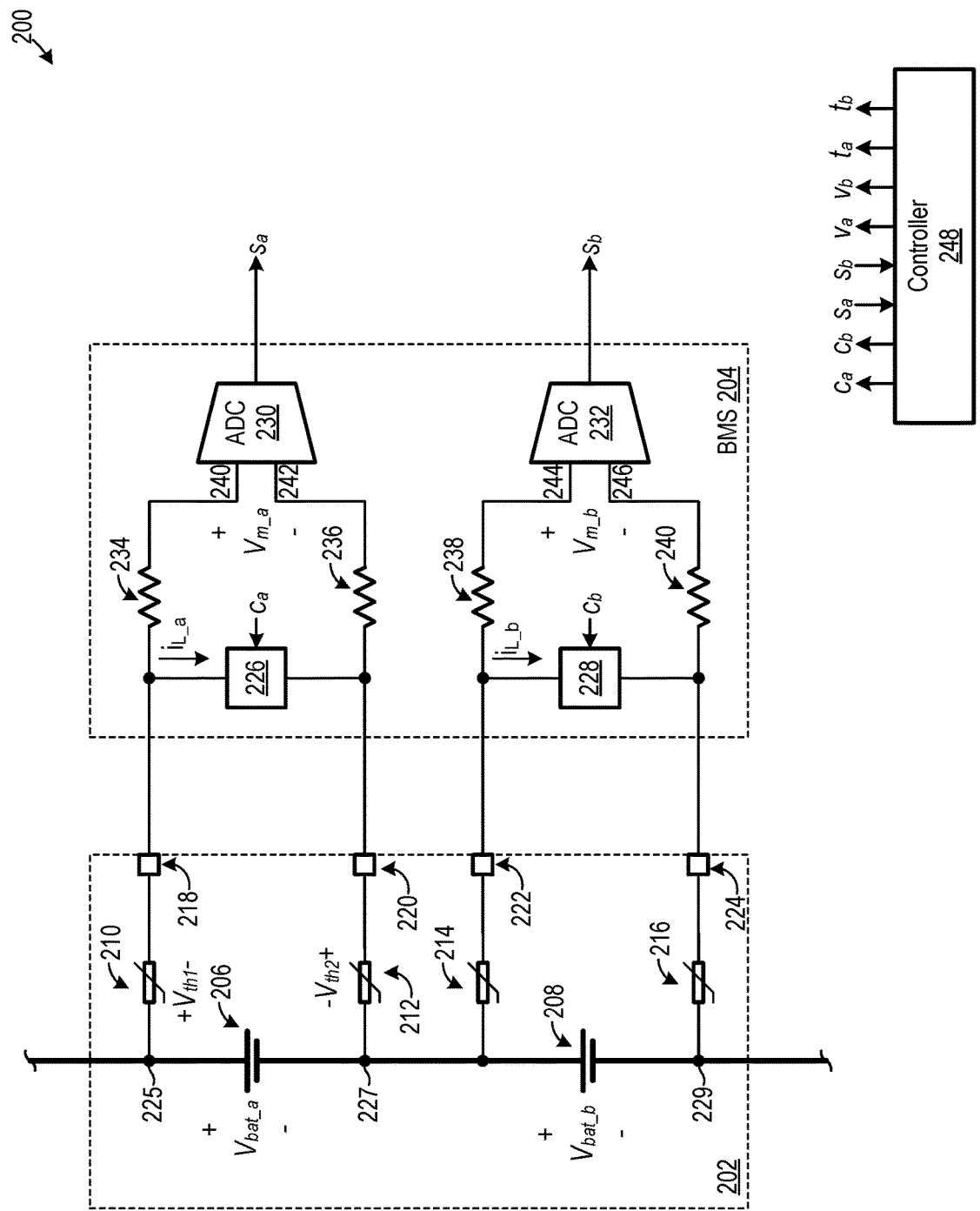
FIG. 2 is a block diagram of a battery module including an electrochemical cell assembly with dual-purpose electrical terminals, according to an embodiment.

FIG. 2 is a block diagram of a battery module 200, which is one embodiment of the new battery modules disclosed herein. Battery module 200 includes an electrochemical cell assembly 202, henceforth referred to as cell assembly 202 for brevity, and a BMS 204. Battery module 200 may include additional elements, e.g., a respective DC-to-DC converter for each electrochemical cell buffering the electrochemical cell from other electrochemical cells, without departing from the scope hereof. Cell assembly 202 includes an electrochemical cell 206, an electrochemical cell 208, a thermistor 210, a thermistor 212, a thermistor 214, a thermistor 216, an electrical terminal 218, an electrical terminal 220, an electrical terminal 222, and an electrical terminal 224. Electrochemical cell 206 is electrically coupled between a battery node 225 and a battery node 227, and electrochemical cell 208 is electrically coupled between battery node 227 and a battery node 229. In some embodiments, each electrochemical cell 206 and 208 is a Lithium-ion (Li-ion) electrochemical cell. Examples of Li-ion electrochemical cells include Lithium Cobalt Oxide (LCO) electrochemical cells, Lithium Manganese Oxide (LMO) electrochemical cells, Lithium Nickel Manganese Cobalt Oxide (NMC) electrochemical cells, Lithium Iron Phosphate (LFP) electrochemical cells, Lithium Nickel Cobalt Aluminum Oxide (NCA) electrochemical cells, and Lithium Titanate (LTO) electrochemical cells.

Thermistor 210 is electrically coupled between battery node 225 and electrical terminal 218, and electrical terminal 218 is therefore electrically coupled to battery node 225 via thermistor 210. Similarly, thermistor 212 is electrically coupled between battery node 227 and electrical terminal 220, and electrical terminal 220 is therefore electrically coupled to battery node 227 via thermistor 212. Additionally, thermistor 214 is electrically coupled between battery node 227 and electrical terminal 222, and thermistor 216 is electrically coupled between battery node 229 and electrical terminal 224. Each thermistor 210, 212, 214, and 216 has resistance that is a function of temperature of the thermistor. For example, in some embodiments, the thermistors are positive temperature coefficient (PTC) thermistors, while in some other embodiments, the thermistors are negative temperature coefficient (NTC) thermistors. Thermistors 210, 212, 214, and 216 could be replaced with other devices having impedance that is a function of temperature. Additionally, one or more of thermistors 210, 212, 214, and 216 could be omitted without departing from the scope hereof. For example, in an alternate embodiment, thermistor 212 is omitted and electrical terminal 220 is directly connected to battery node 227. As another example, two thermistors coupled to a common battery node could be consolidated, such as discussed below with respect to FIG. 4.

Furthermore, one or more of thermistors 210, 212, 214, and 216 could be combined with one or more additional devices. For example, it is generally desirable that thermistors 210, 212, 214, and 216 have relatively low resistances to (1) prevent excessive power dissipation in the thermistors and/or (2) prevent excessive voltage drop across the thermistors. However, low-resistance thermistors may be expensive and/or difficult to procure. Accordingly, in some alternate embodiments, a respective additional resistor (not shown) is electrically coupled in parallel with each thermistor 210, 212, 214, and 216, to reduce magnitude of current flowing through the thermistor, thereby potentially achieving low thermistor power dissipation and low thermistor voltage drop even if the thermistor has a high resistance value. Additionally, some embodiments of cell assembly 202 further include a switch or other device electrically coupled in parallel with one or more of thermistors 210, 212, 214, and 216, such as similar to switching devices 1250 and 1252 of FIG. 12 (discussed below), thereby enabling the thermistors to be selectively bypassed when not needed for cell assembly 202 sensing, such as during electrochemical cell 206 and 208 balancing.

Thermistors 210 and 212 are thermally coupled with electrochemical cell 206, such that temperature of thermistors 210 and 212 is related to temperature of electrochemical cell 206. For example, thermistors 210 and 212 may be attached to electrochemical cell 206, or the thermistors may be near electrochemical cell 206 within cell assembly 202. As another example, thermistors 210 and 212 may be near, or attached to, a thermally conductive electrical bus bar (not shown) connected to electrochemical cell 206, such that the thermistors are thermally coupled to electrochemical cell 206 via the bus bar. Accordingly, electrical terminals 218 and 220 may be used to sense a temperature characteristic of cell assembly 202, e.g., a temperature characteristic of electrochemical cell 206, as discussed below. Additionally, electrical terminals 218 and 220 may be used to sense a voltage $V_{bat\_a}$ across electrochemical cell 206, i.e., a voltage between battery nodes 225 and 227, as discussed below. Therefore, electrical terminals 218 and 220 are dual-purpose electrical terminals, i.e., they are capable of being used to sense both a voltage and a temperature characteristic. Similarly, thermistors 214 and 216 are thermally coupled with electrochemical cell 208, and electrical terminals 222 and 224 may be used to sense voltage $V_{bat\_b}$ across electrochemical cell 208 as well as a temperature characteristic of electrochemical cell 208. Dual-purpose electrical terminals 218, 220, 222, and 224 advantageously eliminate the need for separate electrical connections between cell assembly 202 and BMS 204 for voltage and temperature characteristic sensing. Consequently, cell assembly 202 may be lower cost and simpler to manufacture than a conventional electrochemical cell assembly supporting cell-level temperature sensing. Additionally, in some embodiments, electrochemical cell anode temperature and electrochemical cell cathode temperature can be independently sensed. For example, in a particular embodiment, thermistor 210 is thermally coupled with a cathode of electrochemical cell 206, and thermistor 212 is thermally coupled with an anode of electrochemical cell 206, thereby enabling respective temperature characteristics of the cathode and anode to be independently sensed, such as discussed below with respect to FIGS. 12 and 13.

While FIG. 2 depicts thermistors 210, 212, 214, and 216 being integrated with electrochemical cell assembly 202, the thermistors could alternately be external to cell assembly 202 if the thermistors are thermally coupled with their respective electrochemical cells 206 and 208. For example, in an alternate embodiment (not shown) of cell assembly 202, the cell assembly includes a heatsink for cooling electrochemical cells 206 and 208, the heatsink extends to an outer surface of the cell assembly, and thermistors 210, 212, 214, and 216 are affixed to the heatsink on the outer surface of the cell assembly.

The number of electrochemical cells in cell assembly 202 may vary without departing from the scope hereof. For example, in an alternate embodiment, electrochemical cell 208, as well as its associated thermistors and electrical terminals, are omitted. As another example, in another alternate embodiment, cell assembly 202 includes one or more additional electrochemical cells electrically coupled in series with electrochemical cells 206 and 208. In this alternate embodiment, cell assembly 202 may include a respective pair of thermistors and a respective pair of electrical terminals for each additional electrochemical cell.

BMS 204 includes loading circuitry 226, loading circuitry 228, a voltage sensing device 230, a voltage sensing device 232, a filter resistor 234, a filter resistor 236, a filter resistor 238, and a filter resistor 240. The number of elements of BMS 204 may vary according to the number of electrochemical cells of cell assembly 202. For example, in an alternate embodiment of battery module 200 where electrochemical cell 208 is omitted from cell assembly 202, loading circuitry 228, ADC 232, and filter resistors 238 and 240, which are associated with electrochemical cell 208, are also omitted. As another example, in another alternate embodiment of battery module 200 where cell assembly 202 includes an additional electrochemical cell, BMS 204 includes additional loading circuitry, an additional ADC, and an additional pair of filter resistors associated with the additional electrochemical cell. Furthermore, BMS 204 could be modified to share elements among multiple electrochemical cells. For example, loading circuitry 226 and 228 could be replaced with a single instance of loading circuitry that is capable of being selectively connected to either (a) thermistors 210 and 212 or (b) thermistors 214 and 216. As another example, ADCs 230 and 232 could be replaced with a single ADC with sensing terminals configured to be selectively electrically coupled across either (a) electrical terminals 218 and 220 or (b) electrical terminals 222 and 224.

Loading circuitry 226 is electrically coupled between electrical terminals 218 and 220 of cell assembly 202, and loading circuitry 228 is electrically coupled between electrical terminals 222 and 224 of cell assembly 202. Loading circuitry 226 is configured to (a) draw an electrical current $i_{L\_a}$ through thermistors 210 and 212 when activated by a control signal $c_a$, and (b) not draw electrical current through thermistors 210 and 212 when deactivated by control signal $c_a$. Similarly, loading circuitry 228 is configured to (a) draw an electrical current $i_{L\_b}$ through thermistors 214 and 216 when activated by a control signal $c_b$, and (b) not draw electrical current through thermistors 214 and 216 when deactivated by control signal $c_b$. Two example embodiments of loading circuitry 226 and 228 are discussed below with respect to FIGS. 7 and 8. Loading circuitry 226 and/or 228 may be configured to serve one or more additional purposes in addition to drawing electrical current through thermistors. For example, some embodiments of loading circuitry 226 and 228 are configured to balance SOC of electrochemical cells 206 and 208, respectively, by discharging one or more of the electrochemical cells. It should be noted, however, that battery module 200 is not limited to use with any particular electrochemical cell balancing technique. To the contrary, battery module 200 could be used with essentially any balancing technique including, but not limited to, dissipative balancing techniques, switched capacitor based balancing techniques, switched inductor based balancing techniques, transformer based balancing techniques, DC-to-DC converter based balancing techniques, etc. Furthermore, battery module 200 could be used in a system that does not implement electrochemical cell balancing.

Voltage sensing device 230 includes sensing terminals 240 and 242 electrically coupled to electrical terminals 218 and 220 via filter resistor 234 and filter resistor 236, respectively. Consequently, voltage sensing device 230 is electrically coupled across first and second battery nodes 225 and 227 via thermistors 210 and 212. Voltage sensing device 232 includes sensing terminals 244 and 246 electrically coupled to electrical terminals 222 and 224 via filter resistor 238 and filter resistor 240, respectively. Consequently, voltage sensing device 232 is electrically coupled across battery nodes 227 and 229 via thermistors 214 and 216. In some alternate embodiments, one or more of filter resistors 234, 236, 238, and 240 is omitted or replaced with one or more alternative filter elements. Voltage sensing device 230 is configured to repeatedly sense voltage $V_{m\_a}$ across sensing terminals 240 and 242 and generate a respective signal $s_a$ representing each sensed voltage $V_{m\_a}$. Additionally, voltage sensing device 232 is configured to repeatedly sense voltage $V_{m\_b}$ across sensing terminals 244 and 246 and generate a respective signal $s_b$ representing each sensed voltage $V_{m\_b}$. Signal $s_a$ represents voltage $V_{bat\_a}$ when loading circuitry 226 is disabled, and signal $s_a$ represents voltage $V_{bat\_a}$ minus a temperature offset (from thermistors 210 and 212) when loading circuitry 226 is enabled. Similarly, signal $s_b$ represents voltage $V_{bat\_b}$ when loading circuitry 228 is disabled, and signal $s_b$ represents voltage $V_{bat\_b}$ minus a temperature offset (from thermistors 214 and 216) when loading circuitry 228 is enabled. FIG. 2 illustrates voltage sensing devices 230 and 232 as being an ADCs, such that signals $s_a$ and $s_b$ are digital signals representing sensed voltages $V_{m\_a}$ and $V_{m\_b}$, respectively. However, voltage sensing devices 230 and 232 can take other forms without departing from the scope hereof. For example, in an alternate embodiment, voltage sensing device 230 is a sample-and-hold circuit such that signal $s_a$ is an analog signal equal to, or related to, a value of voltage $V_{m\_a}$.

FIG. 2 further illustrates a controller 248 that is configured to generate control signals $c_a$ and $c_b$ for respectively controlling loading circuitry 226 and 228, as well as to receive signal $s_a$ and $s_b$ from voltage sensing devices 230 and 232, respectively. Controller 248 is additionally configured to generate signals $v_a$, $v_b$, $t_a$, and $t_b$. Signals $v_a$ and $t_a$ represent voltage $V_{bat\_a}$ and a temperature characteristic of electrochemical cell 206, respectively. Signals $v_b$ and $t_b$ represent voltage $V_{bat\_b}$ and a temperature characteristic of electrochemical cell 208, respectively. Controller 248 is formed, for example, of analog electronic circuitry and/or digital electronic circuitry. In some embodiments, controller 248 includes a processor (not shown) and a memory (not shown), where the processor is configured to execute instructions stored in the memory, e.g., instructions in the form of software and/or firmware, to perform one or more functions of controller 248. While controller 248 is depicted as being separate from cell assembly 202 and BMS 204, in some alternate embodiments, controller 248 is at least partially integrated with cell assembly 202 and/or BMS 204. Furthermore, controller 248 could be separate from battery module 200 without departing from the scope hereof. For example, some embodiments of controller 248 are separate from battery module 200 and are configured to serve multiple instances of battery module 200 in a stack, such as discussed below with respect to FIG. 9.

Controller 248 is configured to control loading circuitry 226 to cause loading circuitry 226 to repeatedly change between being activated (where the loading circuitry draws current $i_{L\_a}$ through thermistors 210 and 212) and being deactivated (where the loading circuitry draws no current, or negligible current, through thermistors 210 and 212). Controller 248 is further configured to cause voltage sensing device 230 to sense voltage $V_{m\_a}$ at its sensing terminals 240 and 242 when loading circuitry 226 is activated and when loading circuitry 226 is deactivated, to generate signals $s_a$. Voltage sensing device 230 has a high input impedance, i.e., impedance seen when looking into sensing terminals 240 and 242 is high. Therefore, negligible current flows through thermistors 210 and 212 when loading circuitry 226 is deactivated, and signal $s_a$ therefore represents voltage $V_{bat\_a}$ when loading circuitry 226 is deactivated. Accordingly, controller 248 is configured to generate signals $v_a$ such that each signal $v_a$ represents a respective signal $s_a$ generated when loading circuitry 226 is deactivated. For example, in some embodiments, each signal $v_a$ is equal to a respective signal $s_a$ when loading circuitry 226 is deactivated. Controller 248 is additionally configured to control loading circuitry 228 and voltage sensing device 232 to generate signals $v_b$ in a manner analogous to that discussed above with respect to signal $v_a$.

A temperature characteristic of electrochemical cell 206 can be determined from a difference between two values of signal $s_a$, where one value is generated by voltage sensing device 230 when loading circuitry 226 is activated and the other value is generated by voltage sensing device 230 when loading circuitry 226 is deactivated. For example, assume that $V_B$ is a value of signal $s_a$ generated when loading circuitry 226 is deactivated and that $V_T$ is a value of signal $s_a$ generated when loading circuitry 220 is activated. A difference between $V_B$ and $V_T$ can be expressed by EQN. 1 below, where $V_{Temp}$ is defined in EQN. 2.

$$V_B - V_T = V_B - (V_B - V_{Temp}) = V_{Temp} \qquad \text{(EQN. 1)}$$

$$V_{Temp} = V_{th1} + V_{th2} \qquad \text{(EQN. 2)}$$

As evident from EQN. 2 and FIG. 2, $V_{temp}$ is a sum of a voltage drop $v_{th1}$ across thermistor 210 and a voltage drop $V_{th2}$ across thermistor 212. Accordingly, the difference between $V_B$ and $V_T$ is solely a function of temperature of thermistors 210 and 212. Thus, a difference in two values of signal $s_a$, where one value is generated when loading circuitry 226 is activated and the other value is generated when loading circuitry 226 is deactivated, represents a temperature characteristic of electrochemical cell 206.

Some embodiments of controller 248 are configured to evaluate EQNS. 3 and 4 below, or variations thereof, to determine signal $t_a$. In EQN. 3, $R_T$ is an equivalent resistance of thermistors 210 and 212 (e.g., total resistance of the two thermistors), and $R_L$ is equivalent resistance of loading circuitry 226 when the loading circuitry 226 is activated. $R_L$ can be determined, for example, by dividing voltage across loading circuitry 226 by current $I_{L\_a}$ when the loading circuitry is activated, or $R_L$ may be a known design parameter of loading circuitry 226. K in EQN. 4 is a proportionality constant that relates temperature of thermistors 210 and 212 to $R_T$. In some alternate embodiments, such as when resistance of thermistors 210 and 212 is a non-linear function of temperature, proportionality constant K is replaced with an alternative function relating thermistor temperature to $R_T$. Controller 248 may be further configured to use an analogous procedure to determine signal $t_b$.

$$R_T = R_L \cdot \left(\frac{V_B}{V_T} - 1\right) \qquad \text{(EQN. 3)}$$

$$t_a = K \cdot R_T \qquad \text{(EQN. 4)}$$

In certain embodiments, the temperature characteristics represented by signals $s_a$ and $s_b$ are absolute temperatures of cell assembly 202, e.g., absolute temperatures of electrochemical cells 206 and 208, respectively. In some other embodiments, the temperature characteristics represented by signals $s_a$ and $s_b$ are not necessarily absolute temperatures of electrochemical cells 206 and 208, respectively, but signals $s_a$ and $s_b$ can be used to determine relative temperatures of cell assembly 202, e.g., relative temperatures of electrochemical cells 206 and 208, respectively. For example, a current temperature of electrochemical cell 206 relative to a previous temperature of electrochemical cell 206 could be determined from two values of signal $s_a$ generated at different times. As another example, signals $s_a$ and $s_b$ could be compared to determine a temperature of electrochemical cell 206 relative to a temperature of electrochemical cell 208. As yet another example, a relative temperature characteristic could be a temperature of electrochemical cell 206, represented by signal $s_a$, relative to a mathematical function, e.g., average or median, of respective temperatures of two or more other electrochemical cells, such as other electrochemical cells in a stack (not shown) including multiple instances of battery module 200.

It should be appreciated that knowledge of relative temperatures of electrochemical cells 206 and 208 may be particularly valuable in applications where insufficient information is available to determine absolute temperatures of electrochemical cells 206 and 208. For example, assume that $R_L$ of EQN. 3 or K of EQN. 4 is not known, or is not known with sufficient accuracy, to determine absolute temperature of electrochemical cell 206 using EQNS. 3 and 4. In such case, controller 248 can still accurately determine a relative change in temperature of electrochemical cell 206 from signals $s_a$. For example, EQN. 3 can be evaluated twice as shown below in EQNS. 5 and 6 to respectively yield $R_{T1}$ and $R_{T2}$, where $V_{B1}$ and $V_{B2}$ correspond to signal $s_a$ generated at two different times when loading circuitry 226 is deactivated and $V_{T1}$ and $V_{T2}$ correspond to signal $s_a$ generated at two different times when loading circuitry 226 is activated. A ratio of $R_{T1}$ to $R_{T2}$ can then be determined from EQN. 7, where $R_L$ cancels out. Thus, the ratio of $R_{T1}$ to $R_{T2}$ is not dependent on accurate knowledge of $R_L$, and essentially any value of $R_L$ can be used when evaluating EQNS. 5 and 6 without impairing accuracy of the ratio of $R_{T1}$ to $R_{T2}$.

$$R_{T1} = R_L \cdot \left(\frac{V_{B1}}{V_{T1}} - 1\right) \qquad \text{(EQN. 5)}$$

$$R_{T2} = R_L \cdot \left(\frac{V_{B2}}{V_{T2}} - 1\right) \qquad \text{(EQN. 6)}$$

$$R_{T1}/R_{T2} = \qquad \text{(EQN. 7)}$$
$$R_L \cdot \left(\frac{V_{B1}}{V_{T1}} - 1\right) / R_L \cdot \left(\frac{V_{B2}}{V_{T2}} - 1\right) = \left(\frac{V_{B1}}{V_{T1}} - 1\right) / \left(\frac{V_{B2}}{V_{T2}} - 1\right)$$

Additionally, EQN. 4 can be evaluated twice as shown below in EQNS. 8 and 9 to yield respective temperature signals $t_{a1}$ and $t_{a2}$. A ratio of $t_{a1}$ to $t_{a2}$ can then be determined from EQN. 10, where K cancels out. Thus, the ratio of $t_{a1}$ to $t_{a2}$ is not dependent on accurate knowledge of K, and essentially any value of K can be used when evaluating EQNS. 8 and 9 without impairing accuracy of the ratio of $t_{a1}$ to $t_{a2}$. Thus, change in temperature of electrochemical cell 206 can be accurately determined even if constants of EQNS. 3 and 4 are not accurately known.

$$t_{a1} = K \cdot R_{T1} \qquad \text{(EQN. 8)}$$

$$t_{a2} = K \cdot R_{T2} \qquad \text{(EQN. 9)}$$

$$t_{a1}/t_{a2} = K \cdot R_{T1}/K \cdot R_{T2} = R_{T1}/R_{T2} \qquad \text{(EQN. 10)}$$

It should also be noted that taking a difference between temperature values, e.g., represented by signals $t_a$ and/or $t_b$, may help overcome effects of offset errors in sensed temperature values, because the offset errors may partially or completely cancel when subtracting one temperature value from another. Such difference in temperature values may be between temperature values of a common electrochemical cell taken at different times, or the difference in temperature values may be between respective temperature values of different electrochemical cells.

Figure 3:
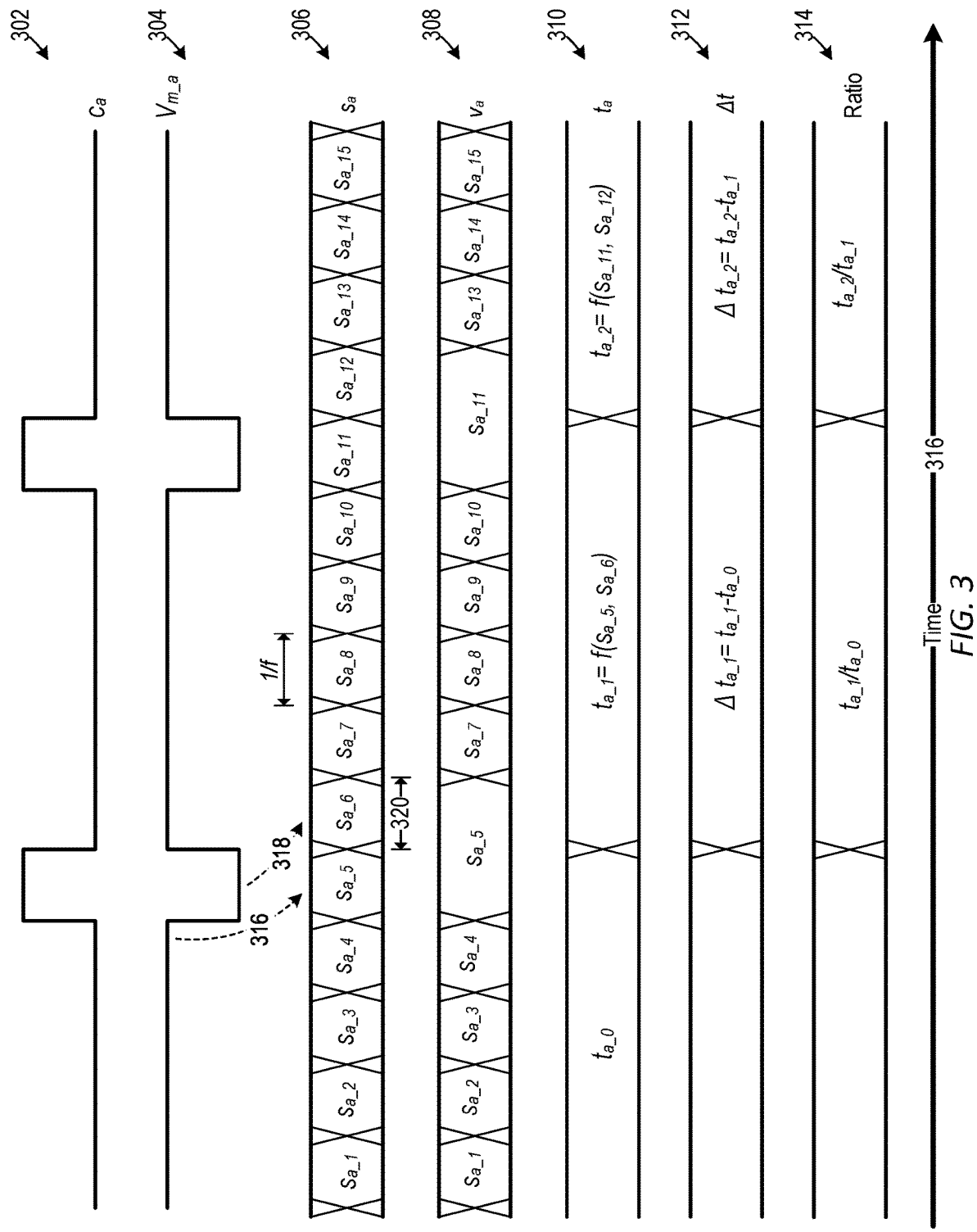
FIG. 3 includes several graphs illustrating one example of operation of the FIG. 2 battery module.

FIG. 3 includes graphs 302-314 illustrating one example of operation of battery module 200. It is understood, though, that battery module 200 is not limited to operating according to the FIG. 3 graphs. Each graph 302-314 has a common time base that is represented by a horizontal line 316 at the bottom of FIG. 3. Graph 302 illustrates control signal $c_a$ versus time, and graph 304 illustrates voltage $V_{m\_a}$ at sensing terminals 240 and 242 of voltage sensing device 230 versus time. In the FIG. 3 example, loading circuitry 226 is activated when control signal $c_a$ is logic high, although loading circuitry 226 is not limited to this configuration. As evident when comparing graphs 302 and 304, voltage $V_{m\_a}$ varies according to whether loading circuitry 226 is activated. Specifically, voltage $V_{m\_a}$ has a larger magnitude when loading circuitry 226 is deactivated than when the loading circuitry 226 is activated, due to voltage drops $V_{th1}$ and $V_{th2}$ across thermistors 210 and 212 when loading circuitry 226 is activated.

Graph 306 illustrates signal $s_a$ as a function of time. In this example, voltage sensing device 230 senses voltage $V_{m\_a}$ and generates corresponding signal $s_a$ at a rate of $1/f$, and signal $s_a$ remains constant until the next time that voltage sensing device 230 senses voltage $V_{m\_a}$. Consequently, signal $s_a$ does not necessarily represent voltage $V_{m\_a}$ in real time—instead, signal $s_a$ represents a most-recently sensed value of voltage of $V_{m\_a}$. For example, signal $s_{a\_5}$ represents voltage $V_{m\_a}$ sensed at a time before control signal $c_a$ is asserted, as illustrated by arrow 316. As another example, signal $s_{a\_6}$ represents voltage $V_{m\_a}$ sensed at a time while control signal $c_a$ is asserted, as illustrated by arrow 318.

Graph 308 represents signal $v_a$ as a function of time. Signal $s_a$ represents voltage $V_{bat\_a}$ across battery nodes 225 and 227 at times when loading circuitry 226 is deactivated, as discussed above. Accordingly, in this example, signal $v_a$ is equal to signal $s_a$, except when signal $s_a$ represents $V_{m\_a}$ at times when loading circuitry 226 is activated. At times when signal $s_a$ represents $V_{m\_a}$ while loading circuitry 226 is activated, signal $v_a$ is equal to an immediately preceding value of signal $s_a$, instead of being equal to the current value of signal $s_a$. For example, signal $s_{a\_6}$ represents $V_{m\_a}$ when loading circuitry 226 is activated, and signal $v_a$ therefore remains equal to signal $s_{a\_5}$ during a duration 320 of signal $s_{a\_6}$, instead of being equal to signal $s_{a\_6}$ during duration 320.

Graph 310 represents signal $t_a$ as a function of time. In this example, controller 248 calculates signal $t_a$ based on a pair of immediately adjacent values of signal $s_a$ in time, such as using EQNS. 3 and 4 above, where one value of the pair corresponds to voltage $V_{m\_a}$ while loading circuitry 226 is deactivated, and the other value of the pair corresponds to voltage $V_{m\_a}$ while loading circuitry 226 is activated. For example, signal $t_{a\_1}$ is calculated from signals $s_{a\_5}$ and $s_{a\_6}$, and signal $t_{a\_2}$ is calculated from signals $s_{a\_1}$ and $s_{a\_2}$. Accordingly, signal $t_a$ is only updated after loading circuitry 226 is activated. Signal $t_{a\_0}$ is calculated from a pair of signal $s_a$ values that occurred before the time period illustrated in FIG. 3, and the values of signal $s_a$ associated with signal $t_{a\_0}$ are therefore not shown in FIG. 3.

Graph 312 represents change in signal $t_a$ as a function of time. As shown in graph 312, signal $t_a$ changes by $\Delta t_{a1}$ between the first and second instances of signal $t_a$ in graph 312, and signal $t_a$ changes by $\Delta t_{a\_2}$ between the second and third instances of signal $t_a$ in graph 312. Graph 314 represents a ratio of a current value of signal $t_a$ over a previous value of signal $t_a$.

Figure 4:
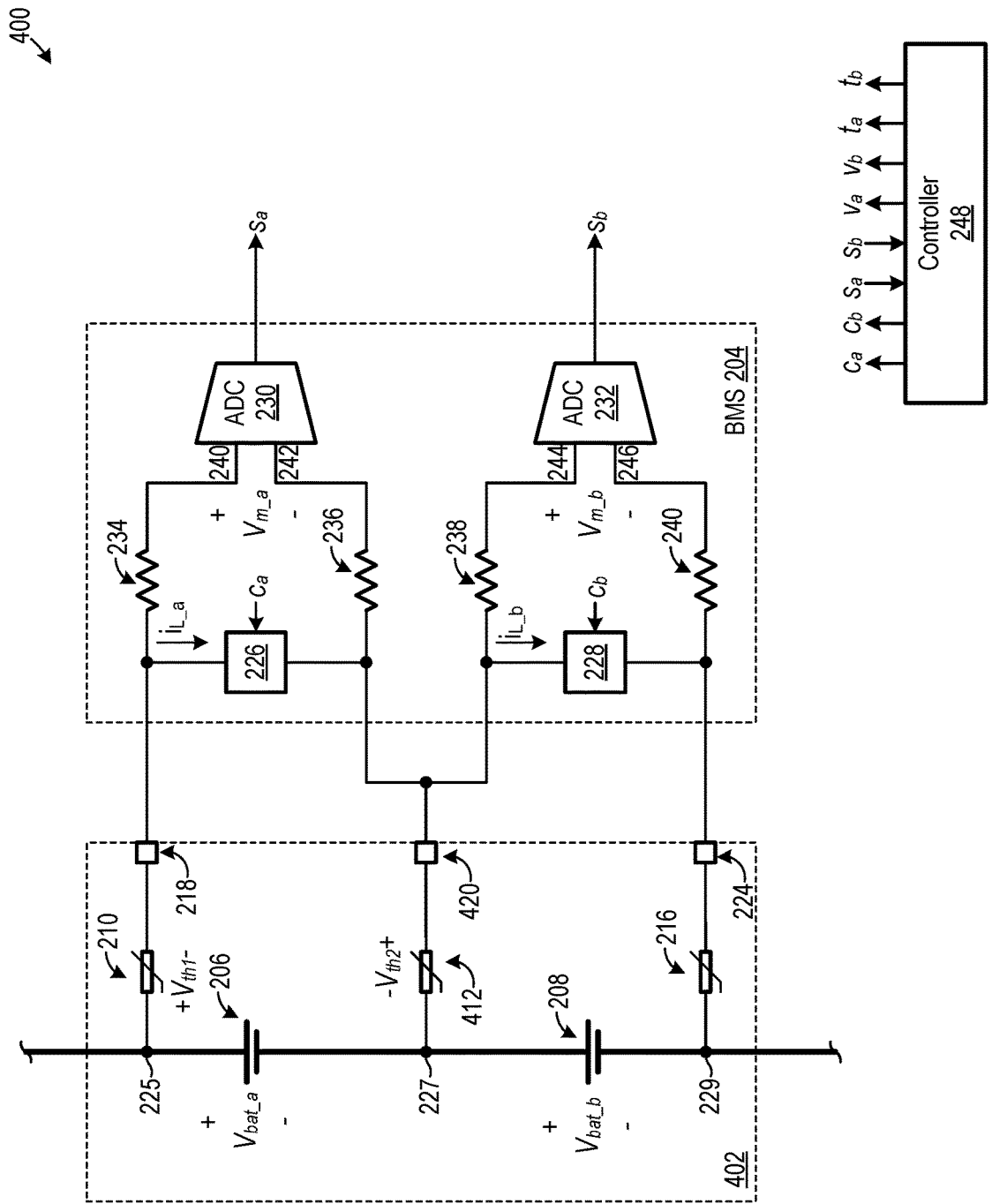
FIG. 4 is a block diagram of an alternate embodiment of the FIG. 2 battery module where several elements of an electrochemical cell assembly have been consolidated.

Referring again to FIG. 2, battery module 200 could be modified to consolidate thermistors that are electrically coupled to a common battery node, as well as to consolidate electrical terminals that are electrically coupled to a common battery node. For example, FIG. 4 is a block diagram of a battery module 400, which is an alternate embodiment of battery module 200 where cell assembly 202 is replaced with a cell assembly 402. Thermistors 212 and 214 are replaced with a single thermistor 412 that performs the functions of each of thermistors 212 and 214, in cell assembly 402. Additionally, electrical terminals 220 and 222 are replaced with a single electrical terminal 420 that performs the functions of each of electrical terminals 220 and 222, in cell assembly 402. Battery module 400 of FIG. 4 operates in the same manner as battery module 200 of FIG. 2.

Figure 5:
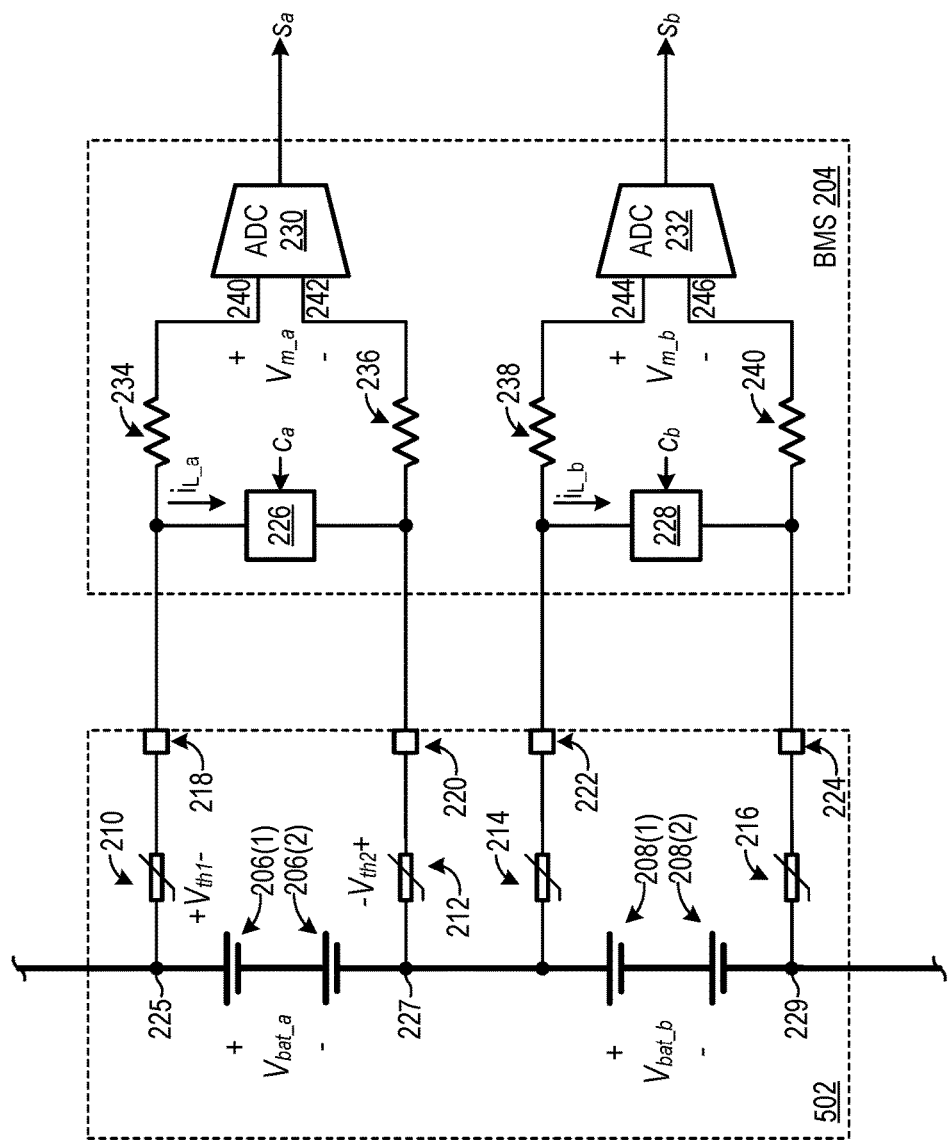
FIG. 5 is a block diagram of an embodiment of the FIG. 2 battery module where an electrochemical cell assembly includes additional electrochemical cells electrically coupled in series.

Referring again to FIG. 2, cell assembly 202 includes a one-to-one ratio of electrochemical cells to loading circuitry and voltage sensing devices, such that battery module 200 is capable of cell-level voltage and temperature sensing. However, cell assembly 202 could be modified to include a plurality of electrochemical cells electrically coupled to a given voltage sensing device and loading circuitry, so that battery module 200 is capable of sensing voltage and temperature of groups of electrochemical cells, instead of being capable of sensing voltage and temperature of individual electrochemical cells. For example, FIG. 5 is a block diagram of a battery module 500, which is an embodiment of battery module 200 where cell assembly 202 is embodied by a cell assembly 502. Cell assembly 502 includes two electrochemical cells 206 electrically coupled between battery nodes 225 and 227, as well as two electrochemical cells 208 electrically coupled between battery nodes 227 and 229. In this document, specific instances of an item may be referred to by use of a numeral in parentheses (e.g. electrochemical cell 206(1)) while numerals without parentheses refer to any such item (e.g. electrochemical cells 206). BMS 204 in battery module 500 is configured to determine voltage and temperature characteristics of pairs of electrochemical cells, instead of determining voltage and temperature of individual electrochemical cells. Cells assembly 502 could be modified to include one or more additional electrochemical cells electrically coupled in series between battery nodes 225 and 227, or between battery nodes 227 and 229, without departing from the scope hereof.

Figure 6:
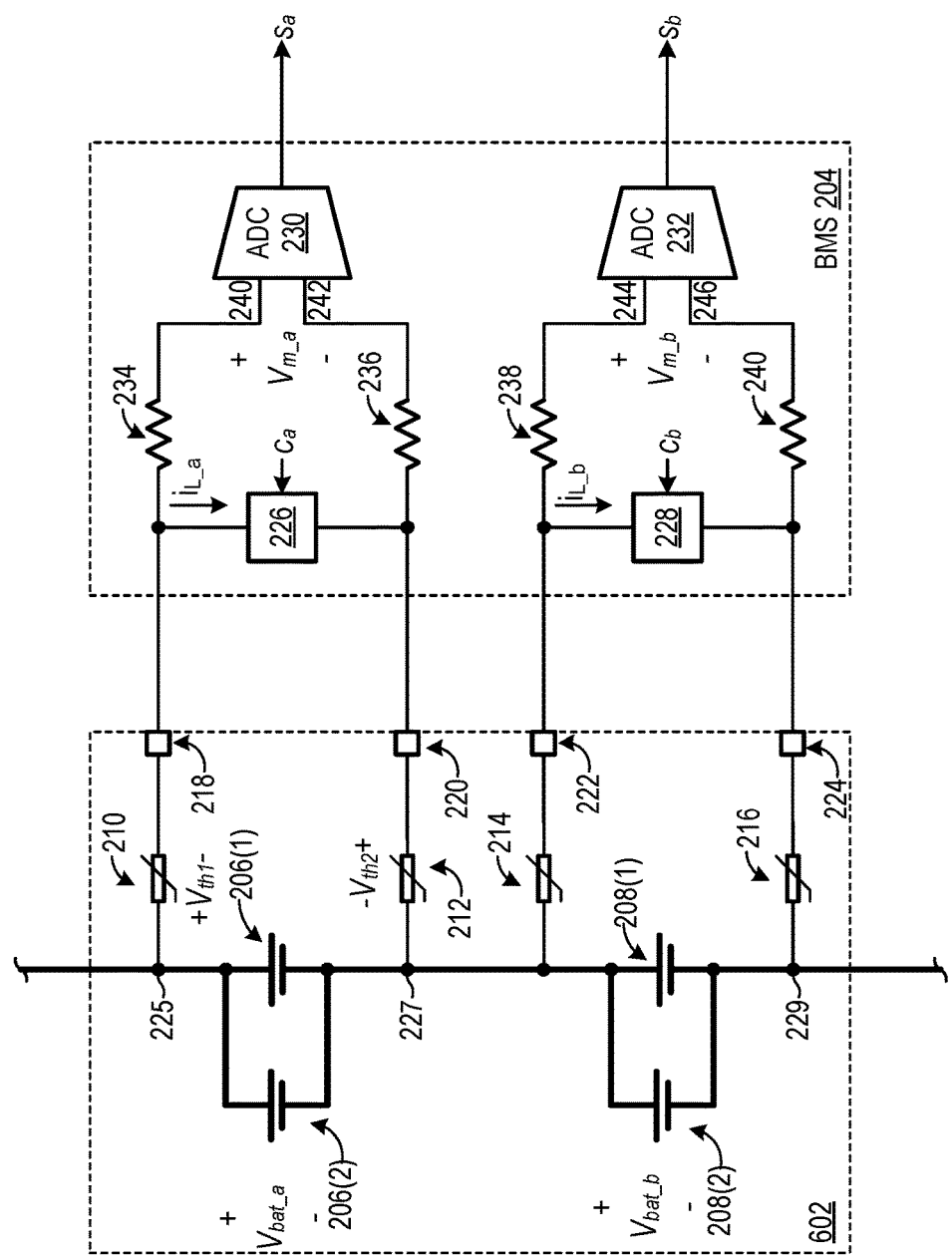
FIG. 6 is a block diagram of an embodiment of the FIG. 2 battery module where an electrochemical cell assembly includes additional electrochemical cells electrically coupled in parallel.

Additionally, cell assembly 202 could be modified to include one or more electrochemical cells electrically coupled in parallel. For example, FIG. 6 is a block diagram of a battery module 600, which is an embodiment of battery module 200 where cell assembly 202 is embodied by a cell assembly 602. Cell assembly 602 includes two electrochemical cells 206 electrically coupled in parallel with each other between battery nodes 225 and 227, as well as two electrochemical cells 208 electrically coupled in parallel with each other between battery nodes 227 and 229. Accordingly, BMS module 204 in battery module 600 is configured to determine voltage and temperature characteristics of pairs of electrochemical cells, instead of determining voltage and temperature of individual electrochemical cells. Cells assembly 602 could be modified to include one or more additional electrochemical cells electrically coupled in parallel between battery nodes 225 and 227, or between battery nodes 227 and 229, without departing from the scope hereof.

Figure 7:
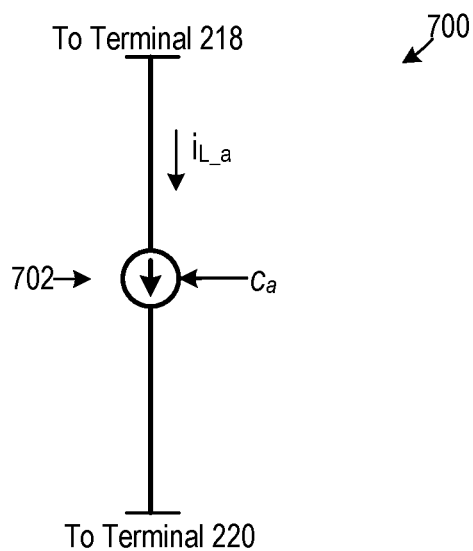
FIG. 7 is a block diagram of an embodiment of loading circuitry of FIG. 2 battery module.
Figure 8:
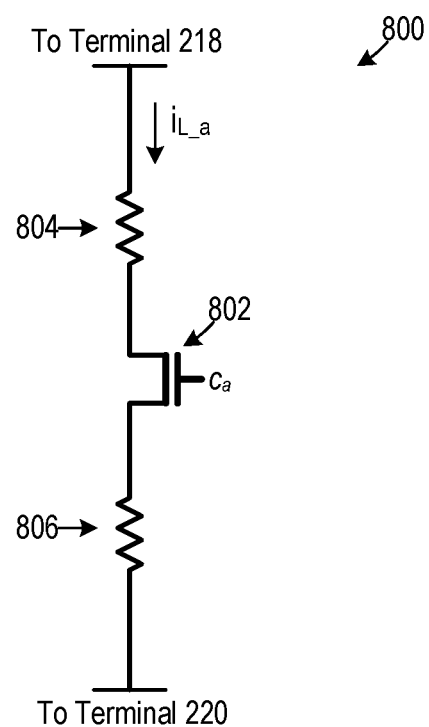
FIG. 8 is a block diagram of another embodiment of loading circuitry of the FIG. 2 battery module.

Referring again to FIG. 2, loading circuitry 226 and 228 can have essentially any configuration as long as the loading circuitry is capable of drawing electrical current $i_{L\_a}$ and $i_{L\_b}$ when activated by control signals $c_a$ and $c_b$, respectively. FIGS. 7 and 8 illustrate two possible embodiments of loading circuitry 226, and loading circuitry 228 could be embodied in similar manners. However, loading circuitry 226 and 228 are not limited to these embodiments. FIG. 7 is a block diagram of loading circuitry 700, which is one possible embodiment of loading circuitry 226. Loading circuitry 700 includes a current source 702 electrically coupled between electrical terminal 218 and electrical terminal 220 of cell assembly 202. Current source 702 is activated by control signal $c_a$ to draw an electrical current $i_{L\_a}$ through thermistors 210 and 212. FIG. 8 is a block diagram of loading circuitry 800, which is another possible embodiment of loading circuitry 226. Loading circuitry 800 includes a transistor 802, a resistor 804, and a resistor 806 electrically coupled in series between electrical terminal 218 and electrical terminal 220. Transistor 802 is, for example, as field effect transistor (FET), such as illustrated in FIG. 8, or a bipolar junction transistor (BJT). Transistor 802 operates in its on-state when activated by control $c_a$, such that resistors 804 and 806 are electrically coupled in series between electrical terminal 218 and electrical terminal 220, thereby causing loading circuitry 800 to draw an electrical current $i_{L\_a}$ through thermistors 210 and 212. The order of elements in the series connection of resistor 804, transistor 802, and resistor 806 may vary. Additionally, the number of resistors in the series connection of loading circuitry 800 may vary. Furthermore, transistor 802 could be replaced with another type of switching device controlled by control signal $c_a$, such as a relay or contactor.

Figure 9:
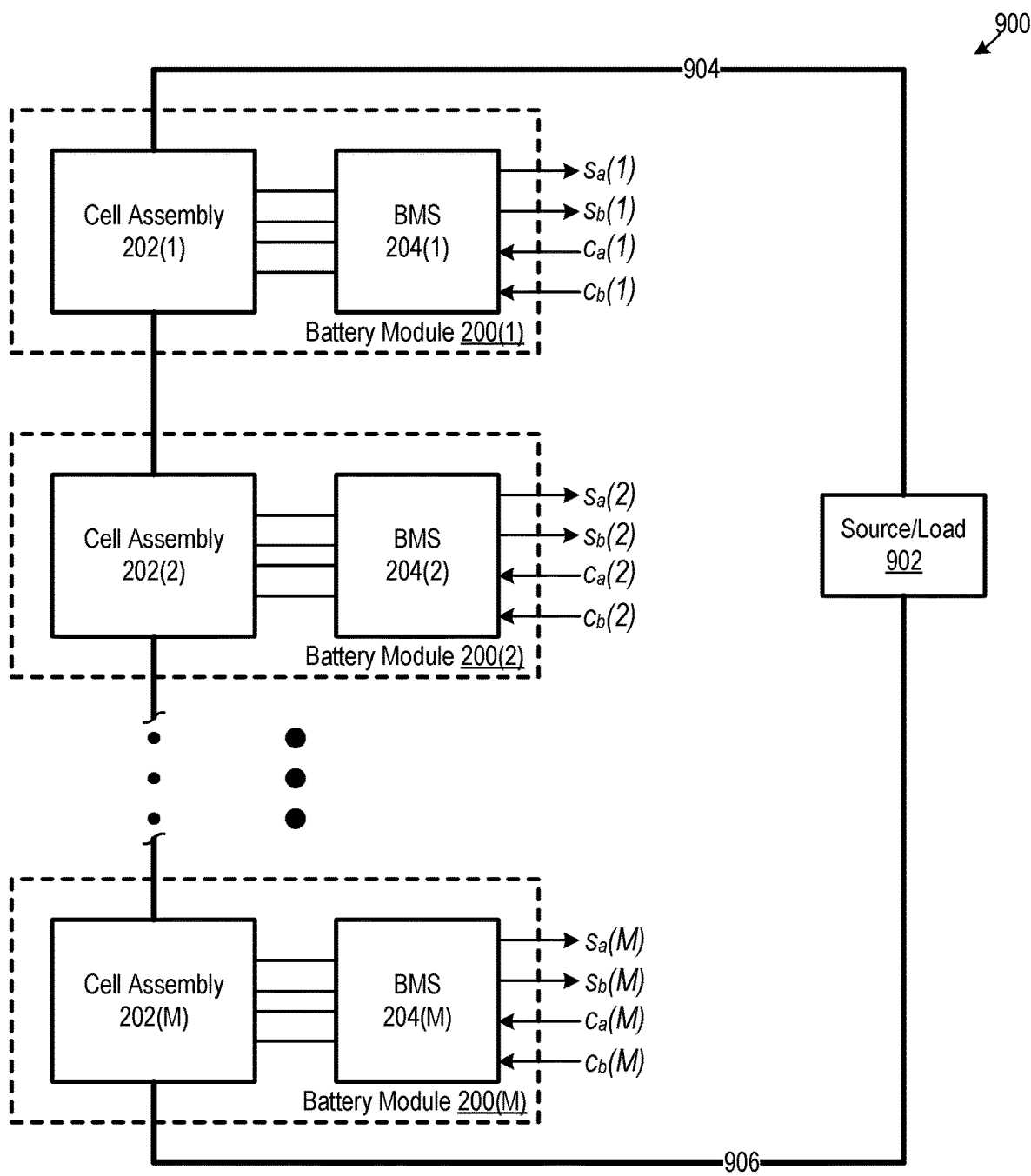
FIG. 9 is a block diagram of a stack including a plurality of instances of the FIG. 2 battery module, according to an embodiment.
Figure 9:
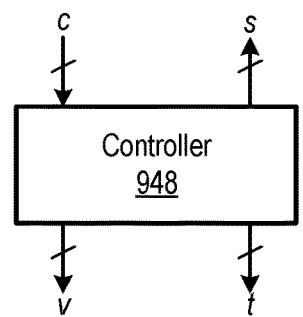

Referring again to FIG. 2, a plurality of battery modules 200 may be combined to form a stack. For example, FIG. 9 is a block diagram of a stack 900 including M instances of battery module 200 and a controller 948, where M is an integer greater than one. Details of cell assemblies 202 and battery management systems 204 are not shown in FIG. 9 for illustrative clarity. A source/load 902 is also shown in FIG. 9, although source/load 902 is not necessarily part of stack 900. Cell assemblies 202 of battery nodes 200 are electrically coupled in series between a first stack power rail 904 and a second stack power rail 906. Source/load 902 is electrically coupled to first and second power rails 904 and 906. One or more additional stacks could be electrically coupled to source/load 902 without departing from the scope hereof.

Source/load 902 can operate as either an electric power source or as a load. Source/load 902 provides electric power to stack 900 when source/load 902 operates as an electric power source, and source/load 902 consumes electric power from stack 900 when source/load 902 operates as a load. In some embodiments, source/load 902 is an inverter which interfaces stack 900 with an alternating current (AC) electric power system (not shown). In some other embodiments, source/load 902 is a DC-to-DC converter which interfaces stack 900 with a direct current (DC) electric power system (not shown). In certain additional embodiments, source/load 902 is an electromechanical device, e.g. a combination motor and generator, that can generate electric power as well as consume electric power. Additionally, source/load 902 may include a plurality of elements. For example, source/load 902 may include a photovoltaic array (not shown) as well as an inverter (not shown) electrically coupling stack 900 with an AC electric power system (not shown). However, source/load 902 can take other forms without departing from the scope hereof.

Controller 948 is an embodiment of controller 248, and controller 948 is configured to perform the functions of controller 248 for each battery module 200(M). For example, controller 948 is configured to (1) generate control signals $c_a(1)$ and $c_b(1)$ for battery module 200(1), (2) receive signals $s_a(1)$ and $s_b(1)$ from battery module 200(1), (3) generate signals $v_a(1)$ and $t_a(1)$, representing a voltage and a temperature characteristic of an electrochemical cell 206 of cell assembly 202(1), respectively, from signal $s_a(1)$, and (4) generate signals $v_b(1)$ and $t_b(1)$, representing a voltage and a temperature characteristic of an electrochemical cell 208 of cell assembly 202(1), respectively, from signal $s_b(1)$. As another example, controller 948 is configured to (1) generate control signals $c_a(2)$ and $c_b(2)$ for battery module 200(2), (2) receive signals $s_a(2)$ and $s_b(2)$ from battery module 200(2), (3) generate signals $v_a(2)$ and $t_a(2)$, representing a voltage and a temperature characteristic of an electrochemical cell 206 of cell assembly 202(2), respectively, from signal $s_a(2)$, and (4) generate signals $v_b(2)$ and $t_b(2)$, representing a voltage and a temperature characteristic of an electrochemical cell 208 of cell assembly 202(2), respectively, from signal $s_b(2)$. As discussed above, in some embodiments, signals $t_a$ and $t_b$ represent relative temperatures of cell assemblies 202. Accordingly, some embodiments of controller 948 are configured to generate each signal $t_a$ and $t_b$ such that it represents a temperature of a respective electrochemical cell relative to a temperature of one or more other electrochemical cells of stack 900. For example, controller 948 could be configured to generate each signal $t_a$ and $t_b$ such that it represents a temperature of a respective electrochemical cell relative to temperature of (1) one or more physically adjacent electrochemical cells of stack 900, (2) an electrochemical cell of stack 900 having a highest temperature of all electrochemical cells of the stack, or (3) an electrochemical cell of stack 900 having a lowest temperature of all electrochemical cells of the stack. Additionally, some embodiments of controller 948 are configured to generate each signal $t_a$ and $t_b$ such that it represents a temperature of a respective electrochemical cell relative to a mathematical function (e.g., average or median) of one or more other electrochemical cells of stack 900.

Although controller 948 is illustrated as being separate from battery modules 200, controller 948 could alternately be at least partially integrated with one or more battery modules 200. Additionally, controller 948 could be external to stack 900 instead of being part of stack 900. Furthermore, controller 948 could be configured to perform additional functions without departing from the scope hereof.

Figure 10:
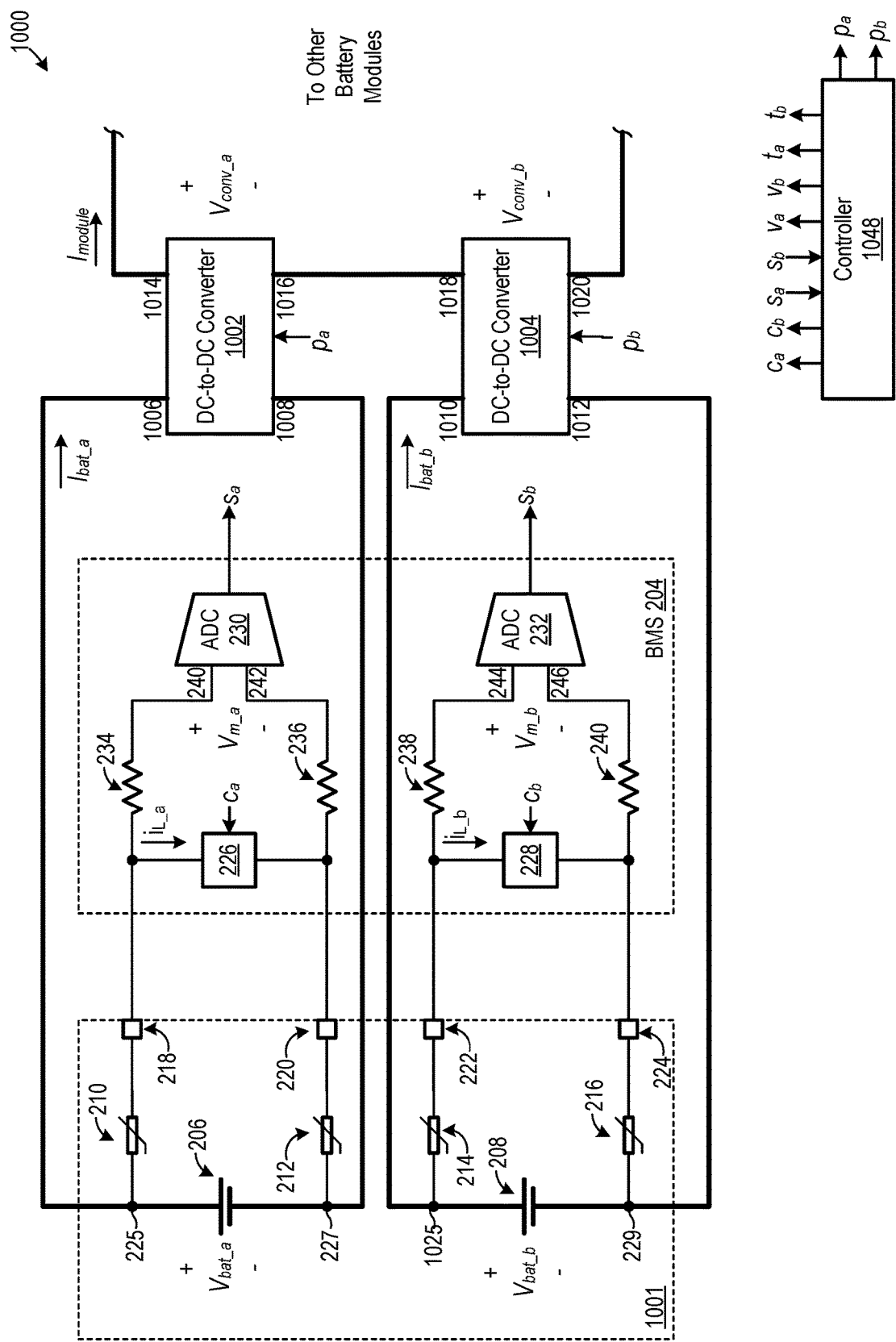
FIG. 10 is a block diagram of an alternate embodiment of the FIG. 2 battery module including direct-current-to-direct-current converters.

As discussed above with respect to FIG. 2, battery module 200 could be modified to include one or more additional elements, such as DC-to-DC converters. FIG. 10 is a block diagram of a battery module 1000, which is an alternate embodiment of battery module 200 that further includes a DC-to-DC converter 1002 and a DC-to-DC converter 1004. Additionally, cell assembly 202 is replaced with a cell assembly 1001 where electrochemical cells 206 and 208 are electrically coupled to respective DC-to-DC converters 1002 and 1004, instead of being electrically coupled in series. Battery nodes 225 and 227 are electrically coupled to terminals 1006 and 1008 of DC-to-DC converter 1002, and battery terminals 1025 and 229 are electrically coupled to terminals 1010 and 1012 of DC-to-DC converter 1004. A terminal 1016 of DC-to-DC converter 1002 is electrically coupled to a terminal 1018 of DC-to-DC converter 1004, and terminals 1014 and 1020 of DC-to-DC converters 1002 and 1004, respectively, are configured to be electrically coupled to one or more other battery modules of a stack.

DC-to-DC converter 1002 buffers electrochemical cell 206 from other electrochemical cells of a stack, and DC-to-DC converter 1004 buffers electrochemical cell 208 from other electrochemical cells of the stack. For example, DC-to-DC converter 1002 may transform voltage $V_{bat\_a}$ across battery terminals 225 and 227 to a voltage $V_{conv-a}$ across DC-to-DC converter terminals 1014 and 1016 (or vice versa). As another example, DC-to-DC converter 1002 may transform current $I_{bat\_a}$ through electrochemical cell 206 to a current $I_{modulee}$ flowing through DC-to-DC converter terminals 1014 and 1016 (or vice versa). Additionally, DC-to-DC converter 1004 may transform voltage $V_{bat\_b}$ across battery terminals 1025 and 229 to a voltage $V_{conv\_b}$ across DC-to-DC converter terminals 1018 and 1020 (or vice versa). Furthermore, DC-to-DC converter 1004 may transform current $I_{bat\_b}$ through electrochemical cell 208 to a current $I_{module}$ flowing through DC-to-DC converter terminals 1018 and 1020 (or vice versa). Each DC-to-DC converter 1002 and 1004 includes, for example, a buck converter, a boost converter, a buck-boost converter, or a buck and boost converter. BMS 204 could be partially or fully integrated with DC-to-DC converter 1002 and/or DC-to-DC converter 1004 without departing from the scope hereof.

Controller 1048 performs the same functions as controller 248 of FIG. 2. Additionally, controller 1048 is configured to generate control signals $p_a$ and $P_b$ to control DC-to-DC converters 1002 and 1004, respectively. For example, controller 1048 may generate control signals $p_a$ and $p_b$ to control charging and/or discharging of electrochemical cells 206 and 208 in a manner which balances SOC of the electrochemical cells, achieves a desired lifetime of the electrochemical cells, achieves a desired performance of the electrochemical cells, promotes safety of the electrochemical cells, achieves uniform temperature of the electrochemical cells, intentionally imbalances the temperature of one or more electrochemical cells, etc. Controller 1048 is formed, for example, of analog electronic circuitry and/or digital electronic circuitry. In some embodiments, controller 1048 includes a processor (not shown) and a memory (not shown), where the processor is configured to execute instructions stored in the memory, e.g., instructions in the form of software and/or firmware, to perform one or more functions of controller 1048. While controller 1048 is depicted as being separate from cell assembly 1001 and BMS 204, in some alternate embodiments, controller 1048 is at least partially integrated with cell assembly 1001 and/or BMS 204. Furthermore, some embodiments of controller 1048 are separate from battery module 1000. For example, some embodiments of controller 1048 are configured to serve multiple instances of battery modules 1000 in a stack, such as discussed below with respect to FIG. 11.

Figure 11:
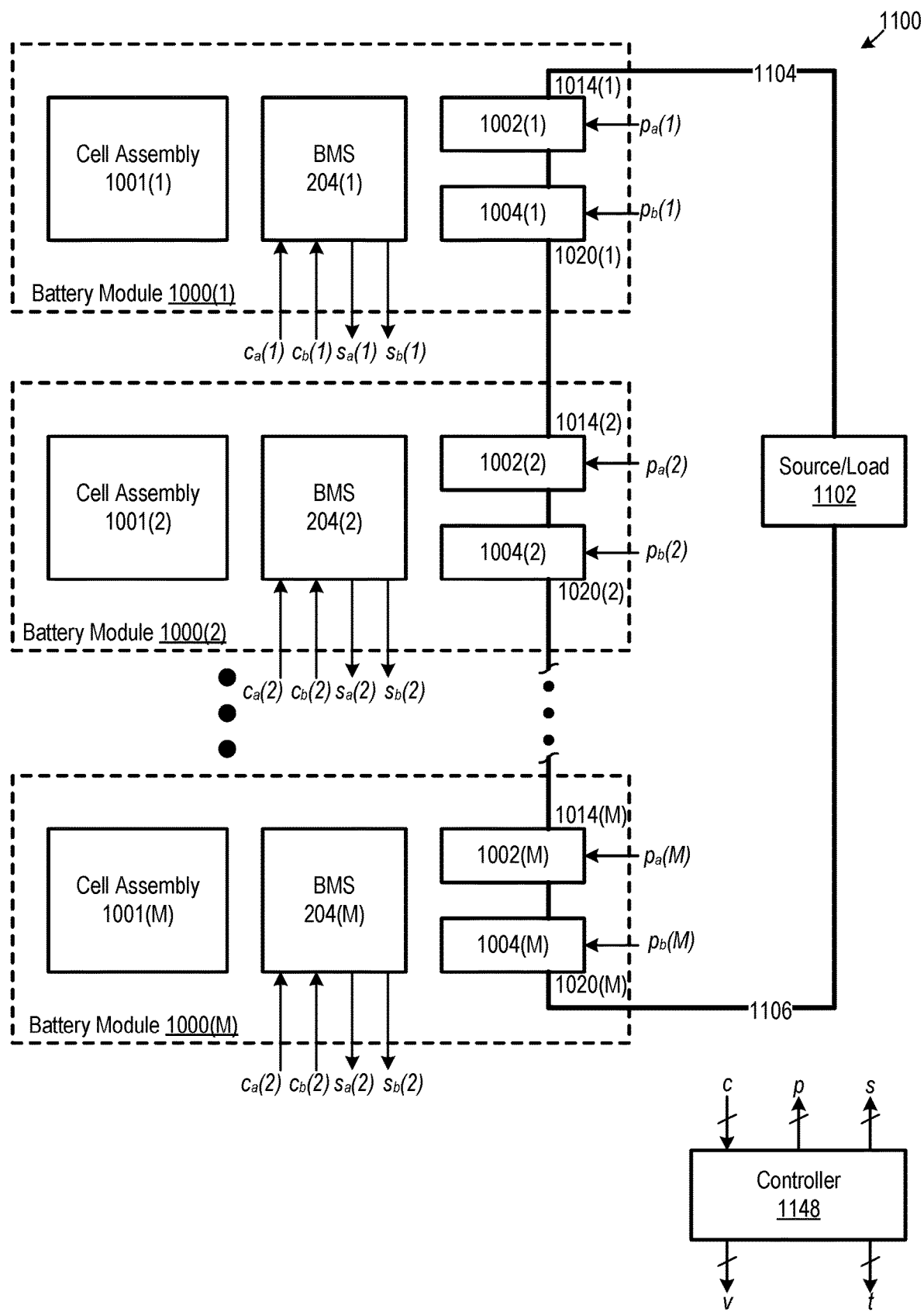
FIG. 11 is a block diagram of a stack including a plurality of instances of the FIG. 10 battery module, according to an embodiment.

FIG. 11 is a block diagram of a stack 1100 including M instances of battery module 1000 and a controller 1148, where M is an integer greater than one. Details of cell assemblies 1001 and battery management systems 204 are not shown in FIG. 11 for illustrative clarity. Additionally, connections between cell assemblies 1001 and battery managements systems 204, and connections between cell assemblies 1001 and DC-to-DC converters 1002 and 1004, are not shown for illustrative clarity. A source/load 1102 is also shown in FIG. 11, although source/load 1102 is not necessarily part of stack 1100. Source/load 1102 is analogous to source/load 902 of FIG. 9. DC-to-DC converters 1002 and 1004 of battery modules 1000 are electrically coupled in series between a first stack power rail 1104 and a second stack power rail 1106. Source/load 1102 is electrically coupled to first and second power rails 1104 and 1106. One or more additional stacks could be electrically coupled to source/load 1102 without departing from the scope hereof.

Controller 1148 is an embodiment of controller 1048, and controller 1148 is configured to perform the functions of controller 1048 for each battery module 1000. For example, controller 1148 is configured to (1) generate control signals $c_a(1)$, $c_b(1)$, $p_a(1)$, $p_b(1)$ for battery module 1000(1), (2) receive signal $s_a(1)$ and $s_b(1)$ from battery module 1000(1), and (3) generate signals $v_a(1)$, $v_b(1)$, $t_a(1)$, and $t_b(1)$ from signals $s_a(1)$ and $s_b(1)$. As another example, controller 1148 is configured to (1) generate control signals $c_a(2)$, $c_b(2)$, $p_a(2)$, $p_b(2)$ for battery module 1000(2), (2) receive signal $s_a(2)$ and $s_b(2)$ from battery module 1000(2), and (3) generate signals $v_a(2)$, $v_b(2)$, $t_a(2)$, and $t_b(2)$ from signals $s_a(2)$ and $s_b(2)$. As discussed above, in some embodiments, signals $t_a$ and $t_b$ represent relative temperatures of electrochemical cell assemblies, such as relative temperatures of constituent electrochemical cells of the cell assemblies. Accordingly, some embodiments of controller 1148 are configured to generate each signal $t_a$ and $t_b$ such that it represents a temperature of a respective one or more electrochemical cell relative to a temperature of one or more other electrochemical cells of stack 1100. For example, controller 1148 could be configured to generate each signal $t_a$ and $t_b$ such that it represents a temperature of a respective one or more electrochemical cells relative to temperature of (1) one or more physically adjacent electrochemical cells of stack 1100, (2) an electrochemical cell of stack 1100 having a highest temperature of all electrochemical cells of the stack, or (3) an electrochemical cell of stack 1100 having a lowest temperature of all electrochemical cells of the stack. Additionally, some embodiments of controller 1148 are configured to generate each signal $t_a$ and $t_b$ such that it represents a temperature of one or more respective electrochemical cells relative to a mathematical function (e.g., average or median) of one or more other electrochemical cells of stack 1100.

Although controller 1148 is illustrated as being separate from battery modules 1000, controller 1148 could alternately be at least partially integrated with one or more battery modules 1000. Additionally, controller 1148 could be external to stack 1100 instead of being part of stack 1100. Furthermore, controller 1148 could be configured to perform additional functions without departing from the scope hereof.

Figure 12:
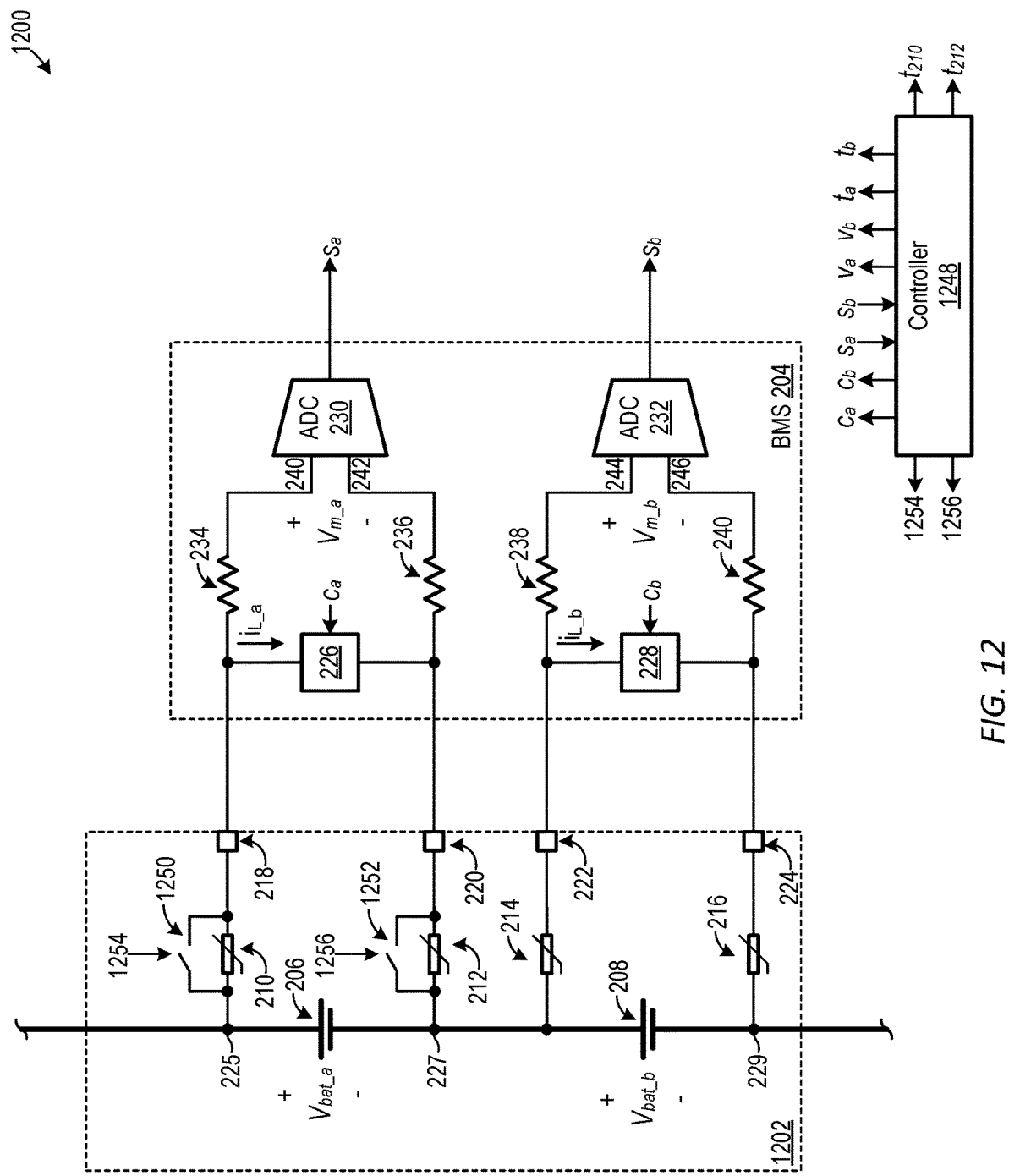
FIG. 12 is a block diagram of an alternate embodiment of the FIG. 2 battery module configured to sense individual thermistor temperature characteristics.

Referring again to FIG. 2, battery module 200 could be modified to be capable of sensing individual temperature characteristics of one or more thermistors 210, 212, 214, and 216, such as by selectively bypassing thermistors and/or by controlling current flow through individual thermistors. For example, FIG. 12 is a block diagram of a battery module 1200, which is an alternate embodiment of battery module 200 where cell assembly 202 is replaced with a cell assembly 1202. Additionally, controller 248 of FIG. 2 is replaced with a controller 1248 in FIG. 12. Battery module 1202 is like battery module 202, but battery module 1202 further includes a switching device 1250 and a switching device 1252. Switching device 1250 is electrically coupled in parallel with thermistor 210, and switching device 1250 is controlled by a control signal 1254. Switching device 1252 is electrically coupled in parallel with thermistor 212, and switching device 1252 is controlled by a control signal 1256. Cell assembly 1202 may further include switching devices (not shown) electrically coupled in parallel with thermistors 214 and 216. Each switching device 1250 and 1252 includes, for example, one or more transistors.

Controller 1248 is like controller 248 of FIG. 2, but controller 1248 is further configured to generate control signals 1254 and 1256 for controlling switching devices 1250 and 1252, respectively. Controller 1248 is configured to bypass one or more of thermistors 210 and 212, such as to enable a temperature characteristic of one of the thermistors to be individually determined, or to bypass thermistors 210 and 212 when they are not needed for sensing. For example, in one operating mode, controller 1248 generates control signals 1254 and 1256 to cause switching device 1250 to operate in its off-state (non-conductive state) and switching device 1252 to operate in its on-state (conductive-state), while loading circuitry 226 is activated. Under these conditions, thermistor 210 is electrically coupled between electrochemical cell 206 and voltage sensing device 230, while thermistor 212 is bypassed. Controller 1248 may then use a value of signal $s_a$ generated under these conditions, along with a value of signal $s_a$ generated when loading circuitry 226 is deactivated, to determine an individual temperature characteristic $t_{210}$ of thermistor 210 (instead of a combined temperature characteristic of thermistors 210 and 212), such as using equations similar to EQNS. 3 and 4 above with the two different values of signal $s_a$. The temperature characteristic of thermistor 210 may represent a temperature characteristic of the cathode of electrochemical cell 206, as discussed above.

Similarly, in another operating mode, controller 1248 generates control signals 1254 and 1256 to cause switching device 1250 to operate in its on-state and switching device 1252 to operate in its off-state, while loading circuitry 226 is activated. Under these conditions, thermistor 212 is electrically coupled between electrochemical cell 206 and voltage sensing device 230, while thermistor 210 is bypassed.

Controller 1248 may then use a value of signal $s_a$ generated under these conditions, along with a value of signal $s_a$ generated when loading circuitry 226 is deactivated, to determine an individual temperature characteristic $t_{212}$ of thermistor 212 (instead of a combined temperature characteristic of thermistors 210 and 212), such as using equations similar to EQNS. 3 and 4 above with the two different values of signal $s_a$. The temperature characteristic of thermistor 212 may represent a temperature characteristic of the anode of electrochemical cell 206, as discussed above.

Furthermore, controller 1248 may generate control signals 1254 and 1256 such that both switching devices 1250 and 1252 operate in their respective off-states, while loading circuitry 226 is activated. Under these conditions, both thermistors 210 and 212 are electrically coupled between electrochemical cell 206 and voltage sensing device 230. Accordingly, controller 1248 may use a value of signal $s_a$ generated under these conditions, along with a value of signal $s_a$ generated when loading circuitry 226 is deactivated, to determine combined temperature characteristic $t_a$ of thermistors 210 and 212, such as using EQNS. 3 and 4 above with the two different values of signal $s_a$. The combined temperature characteristic of thermistors 210 and 212 may represent, for example, an average temperature characteristic of electrochemical cell 206.

Moreover, controller 1248 may generate control signals 1254 and 1256 such that both switching devices 1250 and 1252 operate in their respective on-states, which causes each of thermistors 210 and 212 to be bypassed. It may be desirable to bypass thermistors 210 and 212 when they are not needed for sensing, such as during balancing of electrochemical cells 206 and 208 by loading circuitry 226 and 228, to prevent power dissipation in the thermistors and/or to prevent voltage drop across the thermistors.

Figure 13:
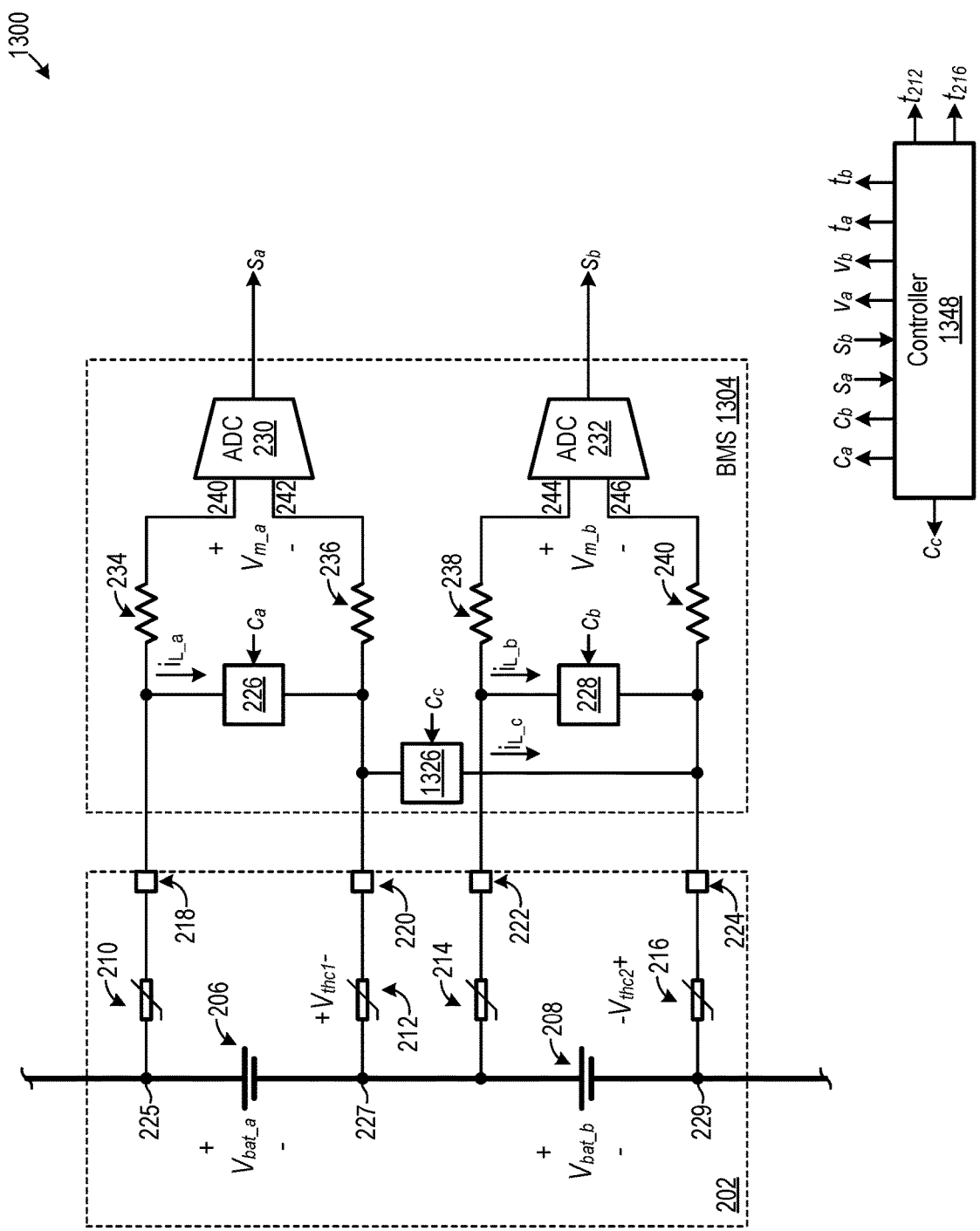
FIG. 13 is a block diagram of another alternate embodiment of the FIG. 2 battery module configured to sense individual thermistor temperature characteristics.

FIG. 13 is a block diagram of a battery module 1300, which is an alternate embodiment of battery module 200 where BMS 204 is replaced with a BMS 1304. Additionally, controller 248 of FIG. 2 is replaced with a controller 1348 in FIG. 13. BMS 1304 is like BMS 204 of FIG. 2, but BMS 1304 further includes loading circuitry 1326 electrically coupled between electrical terminals 220 and 224 of cell assembly 202. Loading circuitry 1326 is configured to (a) draw an electrical current $i_{L\_c}$ through thermistors 212 and 216 when activated by a control signal $c_c$, and (b) not draw electrical current through thermistors 212 and 216 when deactivated by control signal $c_c$. Some embodiments of loading circuitry 1326 are configured in a manner similar to those illustrated in FIG. 7 and FIG. 8.

BMS 1304 includes all functionality of BMS 204 of FIG. 2. Additionally, BMS 1304 and controller 1348 are collectively capable of determining individual temperature characteristics of thermistor 212 and 216. For example, in one operating mode, controller 1348 generates control signals $c_a$ and $c_c$ so that loading circuitry 226 is deactivated and loading circuitry 1326 is activated. Under these conditions, current $i_{L\_c}$ flows through thermistor 212, but negligible current flows through thermistor 210. Consequently, signal $s_a$ represents the sum of voltage $V_{bat\_a}$ and voltage $V_{thc1}$ across thermistor 212, under these conditions. Accordingly, controller 1348 may be configured to use EQNS. 11 and 12 below to determine temperature characteristic $t_{212}$ of thermistor 212, where K is the constant discussed above with respect to EQN. 4, $V_{T212}$ is a value of signal $s_a$ when loading circuitry 226 is deactivated and loading circuitry 1326 is activated, and $V_{B1}$ is a value of signal $s_a$ when both of loading circuitries 226 and 1326 are deactivated. Current $i_{L\_c}$ is known, for example, as a design parameter of loading circuitry 1326.

$$R_{212} = \frac{V_{T212} - V_{B1}}{i_{L\_c}} \quad \text{(EQN. 11)}$$

$$t_{212} = K \cdot R_{212} \quad \text{(EQN. 12)}$$

As another example, in another operating mode, controller 1348 generates control signals $c_b$ and $c_c$ so that loading circuitry 228 is deactivated and loading circuitry 1326 is activated. Under these conditions, current $i_{L\_c}$ flows through thermistor 216, but negligible current flows through thermistor 214. Consequently, signal $s_b$ represents voltage $V_{bat\_b}$ minus voltage $V_{thc2}$ across thermistor 216, under these conditions. Accordingly, controller 1348 may be configured to use EQNS. 13 and 14 below to determine a temperature characteristic $t_{216}$ of thermistor 216, where K is the constant discussed above with respect to EQN. 4, $V_{T216}$ is a value of signal $s_b$ when loading circuitry 228 is deactivated and loading circuitry 1326 is activated, and $V_{B2}$ is a value of signal $s_b$ when both of loading circuitries 228 and 1326 are deactivated.

$$R_{216} = \frac{V_{B2} - V_{T216}}{i_{L\_c}} \quad \text{(EQN. 13)}$$

$$t_{216} = K \cdot R_{216} \quad \text{(EQN. 14)}$$

BMS 1304 could be modified to include additional loading circuitry analogous to loading circuitry 1326 that is electrically coupled between electrical terminals 218 and 222 of cell assembly 202, to enable controller 1348 to determine individual temperature characteristics of thermistors 210 and 214. Additionally, two or more loading circuitries of BMS 1304 could be combined or at least partially implemented by common components, such as by a single current source and switches to selectively couple the current source to various electrical terminals of cell assembly 202.

Figure 14:
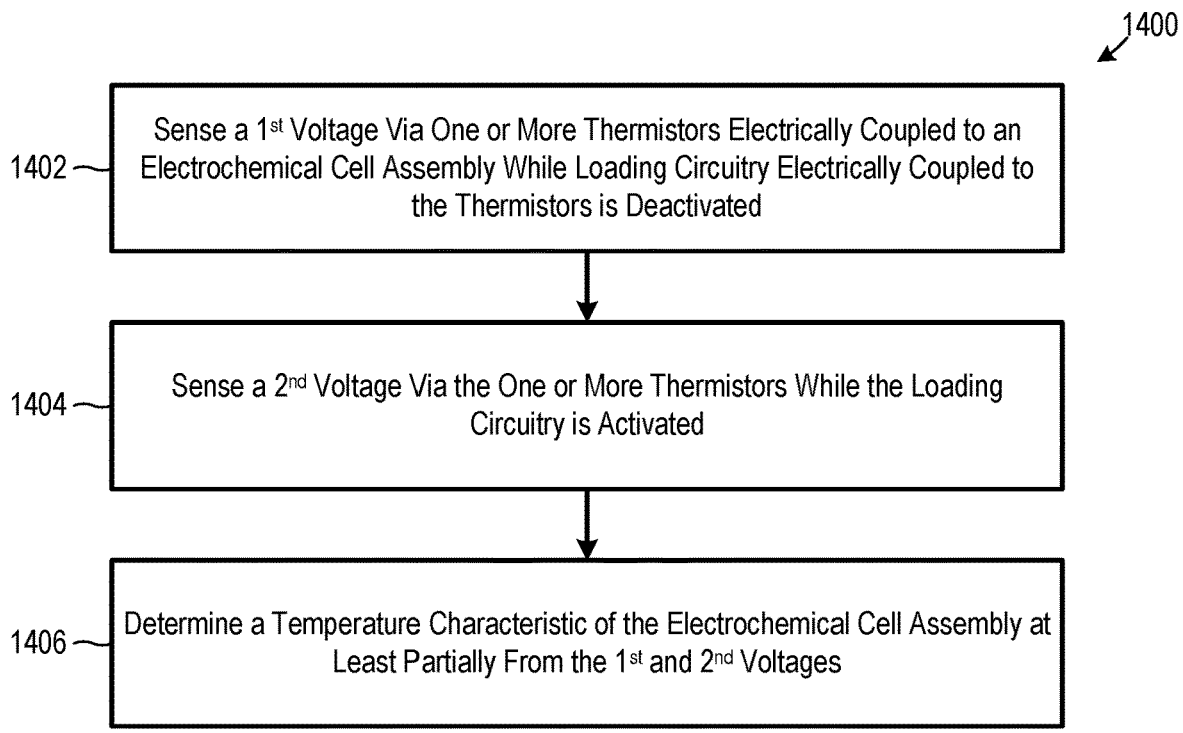
FIG. 14 is a flow chart of a method for determining a temperature characteristic of an electrochemical cell assembly, according to an embodiment.

FIG. 14 is a flow chart of a method 1400 for determining a temperature characteristic of an electrochemical cell assembly. In a block 1402 of method 1400, a first voltage is sensed via one or more thermistors electrically coupled to the electrochemical cell assembly while loading circuitry electrically coupled to the thermistors is deactivated. In one example of block 1402, voltage sensing device 230 senses a first voltage $V_{m\_a}$ via thermistors 210 and 212 while loading circuitry 226 is deactivated to generate a signal $s_{a1}$ representing the first voltage. In a block 1404 of method 1400, a second voltage is sensed via the one or more thermistors while the loading circuitry is activated. In one example of block 1404, voltage sensing device 230 senses a second voltage $V_{m\_a}$ via thermistors 210 and 212 while loading circuitry 226 is activated to generate a signal $s_{a2}$ representing the second voltage. In a block 1406 of method 1400, the temperature characteristic of the electrochemical cell assembly is determined at least partially from the first and second voltages. In one example of block 1406, controller 248 generates a signal $t_a$ representing the temperature characteristic from signals $s_{a1}$ and $s_{a2}$ determined in blocks 1402 and 1404, respectively.

Figure 15:
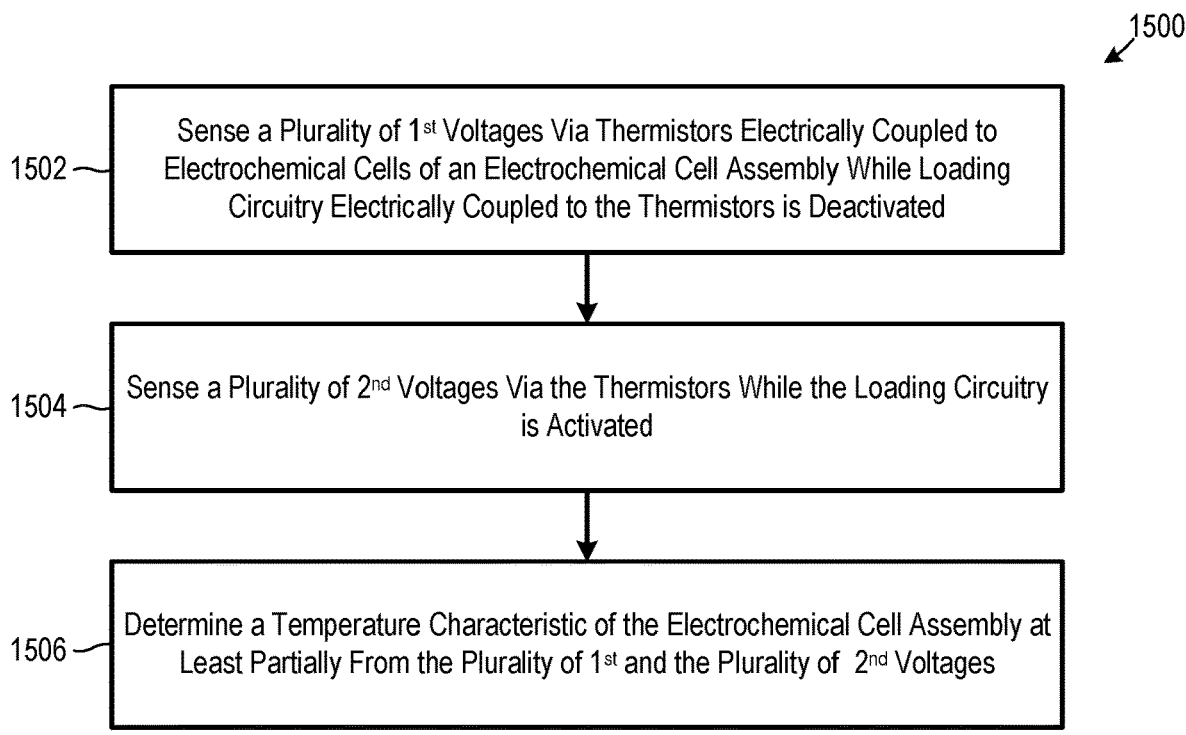
FIG. 15 is a flow chart of another method for determining a temperature characteristic of an electrochemical cell assembly, according to an embodiment.

FIG. 15 is a flow chart of a method 1500 for determining a temperature characteristic of an electrochemical cell assembly. In a block 1502 of method 1500, a plurality of first voltages are sensed via thermistors electrically coupled to electrochemical cells of the electrochemical cell assembly while loading circuitry electrically coupled to the thermistors is deactivated. In one example of block 1502, a plurality of battery modules 200 sense respective first voltages $V_{m\_a}$ while loading circuitry of the battery modules is deactivated to generate respective first signals $s_{a1}$. In another example of block 1502, a single battery module 200 senses two instances of a first voltage $V_{m\_a}$ while loading circuitry of the battery module is deactivated to generate two respective first signals $s_{a1}$. In a block 1504 of method 1500, a plurality of second voltages are sensed via the thermistors while the loading circuitry is activated. In one example of block 1504, the plurality of battery modules 200 sense respective second voltages $V_{m\_a}$ while loading circuitry of the battery modules is activated to generate respective first signals $s_{a2}$. In another example of block 1504, a single battery module 200 senses two instances of a second voltage $V_{m\_a}$ while loading circuitry of the battery module is activated to generate two respective second signals $s_{a2}$. In a block 1506 of method 1500, the temperature characteristic is determined at least partially from the plurality of first voltages and the plurality of second voltages. In one example of block 1506, controller 248 generates a signal $t_a$ representing the temperature characteristic from a plurality of signals $s_{a1}$ and a plurality of signals $s_{a2}$ determined in blocks 1502 and 1504, respectively, e.g., from (1) an average, median, or other mathematical function of the plurality of signals $s_{a1}$ and (2) an average, median, or other mathematical function of the plurality of signals $s_{a2}$.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for determining a temperature characteristic of an electrochemical cell assembly, comprising:
   sensing a first voltage via one or more thermistors electrically coupling the electrochemical cell assembly to a battery management system while loading circuitry electrically coupled to the thermistors is deactivated;
   sensing a second voltage via the one or more thermistors while the loading circuitry is activated; and
   determining the temperature characteristic of the electrochemical cell assembly at least partially from the first and second voltages.

2. The method of claim 1, wherein the one or more thermistors are thermally coupled with electrochemical cells of the electrochemical cell assembly.

3. The method of claim 2, wherein the one or more thermistors are integrated with the electrochemical cell assembly.

4. The method of claim 1, further comprising activating the loading circuitry by causing the loading circuitry to draw an electric current through the one or more thermistors.

5. The method of claim 1, wherein the loading circuitry is configured to balance a state of charge of the electrochemical cell assembly.

6. The method of claim 1, wherein the first voltage is a voltage across one or more electrochemical cells of the electrochemical cell assembly.

7. The method of claim 6, further comprising determining a voltage of the electrochemical cell assembly at least partially based on the first voltage.

8. The method of claim 1, wherein determining the temperature characteristic of the electrochemical cell assembly at least partially from the first and second voltages comprises:
   determining a resistance of the one or more thermistors at least partially from the first and second voltages; and
   determining the temperature characteristic of the electrochemical cell assembly from the resistance of the one or more thermistors.

9. The method of claim 8, wherein:
   the one or more thermistors comprise a plurality of thermistors; and
   the resistance of the one or more thermistors is a total resistance of the one or more thermistors.

10. The method of claim 1, wherein the temperature characteristic of the electrochemical cell assembly is an absolute temperature of the electrochemical cell assembly.

11. The method of claim 1, wherein the temperature characteristic of the electrochemical cell assembly is a relative temperature of the electrochemical cell assembly.

12. A battery module, comprising:
    an electrochemical cell assembly configured for voltage and temperature sensing via a common pair of electrical terminals, including:
       one or more electrochemical cells electrically coupled between a first battery node and a second battery node,
       a first thermistor,
       a first electrical terminal for sensing voltage and temperature of the electrochemical cell assembly, the first electrical terminal being electrically coupled to the first battery node via the first thermistor, and
       a second electrical terminal for sensing voltage and temperature of the electrochemical cell assembly, the second electrical terminal being electrically coupled to the second battery node; and
    a battery management system (BMS) electrically coupled to each of the first and second electrical terminals,
    the electrochemical cell assembly and the BMS being collectively configured such that the BMS is capable of sensing at least both of a temperature characteristic of the electrochemical cell assembly and a voltage of the electrochemical cell assembly solely via the first and second electrical terminals.

13. The battery module of claim 12, wherein the electrochemical cell assembly further includes a second thermistor, and wherein the second electrical terminal is electrically coupled to the second battery node via the second thermistor.

14. The battery module of claim 13, wherein each of the first and second thermistors is thermally coupled with the one or more electrochemical cells.

15. The battery module of claim 12, wherein the BMS is further configured to balance a state of charge of the electrochemical cell assembly.

16. A method for determining a temperature characteristic of an electrochemical cell assembly, comprising:
    sensing a plurality of first voltages via thermistors electrically coupling electrochemical cells of the electrochemical cell assembly to a battery management system while loading circuitry electrically coupled to the thermistors is deactivated;

sensing a plurality of second voltages via the thermistors while the loading circuitry is activated; and determining the temperature characteristic at least partially from the plurality of first voltages and the plurality of second voltages.

17. The method of claim 16, wherein the temperature characteristic is a relative temperature of the electrochemical cell assembly.

18. The method of claim 17, wherein the relative temperature of the electrochemical cell assembly is a temperature of the electrochemical cell assembly relative to a temperature of one or more other electrochemical cell assemblies.

19. The method of claim 17, wherein the relative temperature of the electrochemical cell assembly is a temperature of the electrochemical cell assembly relative to a mathematical function of respective temperatures of two or more other electrochemical cell assemblies.

20. The method of claim 17, wherein the relative temperature of the electrochemical cell assembly is a current temperature of the electrochemical assembly relative to a previous temperature of the electrochemical assembly.

* * * * *